(12) United States Patent
Kuwahara

(10) Patent No.: US 12,014,940 B2
(45) Date of Patent: Jun. 18, 2024

(54) SUBSTRATE TREATING SYSTEM AND SUBSTRATE TRANSPORTING METHOD

(71) Applicant: SCREEN Holdings Co., Ltd., Kyoto (JP)

(72) Inventor: Joji Kuwahara, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 980 days.

(21) Appl. No.: 16/931,515

(22) Filed: Jul. 17, 2020

(65) Prior Publication Data
US 2021/0020473 A1    Jan. 21, 2021

(30) Foreign Application Priority Data
Jul. 19, 2019    (JP) .................................. 2019-133794

(51) Int. Cl.
| | |
|---|---|
| H01L 21/67 | (2006.01) |
| C23C 16/02 | (2006.01) |
| C23C 16/56 | (2006.01) |
| G03F 7/16 | (2006.01) |
| H01L 21/677 | (2006.01) |

(52) U.S. Cl.
CPC .... *H01L 21/67115* (2013.01); *C23C 16/0227* (2013.01); *C23C 16/56* (2013.01); *G03F 7/162* (2013.01); *H01L 21/67173* (2013.01); *H01L 21/67178* (2013.01); *H01L 21/67745* (2013.01)

(58) Field of Classification Search
USPC .................................... 118/500, 66, 55, 612
See application file for complete search history.

(56) References Cited

U.S. PATENT DOCUMENTS

| | | | |
|---|---|---|---|
| 5,697,748 A | 12/1997 | Somekh et al. | ............... 414/217 |
| 5,844,662 A | 12/1998 | Akimoto et al. | ................ 355/27 |
| 6,790,286 B2 * | 9/2004 | Nishimura | ........ H01L 21/67766 |
| | | | 156/345.31 |
| 2011/0222994 A1 | 9/2011 | Inagaki et al. | ........... 414/222.07 |

(Continued)

FOREIGN PATENT DOCUMENTS

| | | | | |
|---|---|---|---|---|
| JP | H09-045613 A | | 2/1997 | |
| JP | 2007173695 A | * | 7/2007 | ....... H01L 21/67173 |

(Continued)

OTHER PUBLICATIONS

English Translation 2007-173695A (Year: 2007).*

(Continued)

*Primary Examiner* — Yewebdar T Tadesse
(74) *Attorney, Agent, or Firm* — OSTROLENK FABER LLP

(57) ABSTRACT

Disclosed is a substrate treating system and a substrate transporting method. For instance, it is assumed that an indexer block, a first treating block, and a second treating block are arranged in this order. In this case, for transporting a substrate treated in the second treating block to an indexer block, the substrate is necessarily sent through the first treating block without any treatment in the first treating block. However, the first treating block and the second treating block are both connected to the indexer block. Therefore, transportation of the substrate is performable directly from the second treating block to the indexer block without through the first treating block. Therefore, reduction in throughput is suppressible.

12 Claims, 25 Drawing Sheets

(56) References Cited

U.S. PATENT DOCUMENTS

| | | | |
|---|---|---|---|
| 2012/0058253 A1 | 3/2012 | Miyata et al. | 427/58 |
| 2014/0022521 A1 | 1/2014 | Harumoto et al. | 355/27 |
| 2018/0052393 A1* | 2/2018 | Nishiyama | B05C 13/02 |
| 2020/0211880 A1* | 7/2020 | Kuwahara | H01L 21/67733 |

FOREIGN PATENT DOCUMENTS

| | | |
|---|---|---|
| JP | 2008-263004 A | 10/2008 |
| JP | 2009-283980 A | 12/2009 |
| JP | 2011-187796 A | 9/2011 |
| JP | 2014-022570 A | 2/2014 |
| JP | 2016-201526 A | 12/2016 |
| KR | 10-0346773 B1 | 2/1995 |
| KR | 10-2010-0023259 A | 3/2010 |
| KR | 10-2012-0024388 A | 3/2012 |
| TW | 201828348 A | 8/2018 |
| TW | 201841688 A | 12/2018 |

OTHER PUBLICATIONS

Office Action dated Mar. 16, 2021 for corresponding Taiwan Patent Application No. 109124024.
Office Action dated Aug. 29, 2022 for corresponding Korean Patent Application No. 10-2020-0088878.
Office Action dated Jan. 28, 2022 for corresponding Korean Patent Application No. 10-2020-0088878.
Office Action dated May 16, 2023 for corresponding Japanese Patent Application No. 2019-133794.

* cited by examiner

SUBSTRATE TREATING SYSTEM AND SUBSTRATE TRANSPORTING METHOD

CROSS-REFERENCE TO RELATED APPLICATIONS

This application claims priority to Japanese Patent Application No. 2019-133794 filed Jul. 19, 2019, the subject matter of which is incorporated herein by reference in entirety.

BACKGROUND OF THE INVENTION

Technical Field

The present invention relates to a substrate treating system for treating substrates, and a substrate transporting method of the substrate treating system. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

Description of the Related Art

A currently-used substrate treating apparatus includes an indexer block (hereinafter referred to as an "ID block" as appropriate) and a treating block (for example, see Japanese Unexamined Patent Application Publication No. 2014-022570A). The treating block is connected horizontally with respect to the ID block. A carrier platform for placing carriers is provided in the ID block. The carrier platform is disposed opposite to the treating block across the ID block.

Moreover, the substrate treating apparatus includes a stocker device (carrier buffer device). See for example, Japanese Unexamined Patent Application Publication No. 2011-187796A. The stocker device is disposed on the opposite side of the treating block across the ID block. The stocker device includes a carrier storage shelf for storing carriers and a carrier transport mechanism for transporting the carriers.

Japanese Unexamined Patent Application Publication No. 2016-201526A discloses a substrate treating system including a delivery block disposed between an ID block and a treating block. The delivery block includes a plurality of buffer units arranged in a vertical direction, and two transfer devices arranged across the buffer units. The two transfer devices are arranged in a horizontal direction (Y direction) perpendicular to a direction (X direction) in which the ID block and the treating block are arranged.

Moreover, Japanese Unexamined Patent Application Publication No. H09-045613A discloses a substrate treating apparatus in which a coating-treatment block, a cassette station (corresponding to an ID block), and a developing-treatment block are linearly connected in a horizontal direction in this order. The cassette station is configured such that four cassettes containing either an untreated substrate or a treated substrate are arrangeable therein. In addition, a first mounting platform for alignment of the substrate is provided at a boundary between the coating-treatment block and the cassette station, and a second mounting platform for alignment of the substrate is provided at a boundary between the cassette station and the developing-treatment block. One transport mechanism in the cassette station transports the substrates through the mounting platforms to the coating-treatment block and the developing-treatment block.

SUMMARY OF THE INVENTION

For instance, as shown in FIG. 1, a substrate treating apparatus 201 includes an ID block 202 at one end thereof, and the ID block 202, a first treating block 203, and a second treating block 205 are horizontally arranged in this order. The substrate is transported from the ID block 202 to the first treating block 203 and the second treating block 205 in this order. At this time, a first treatment is performed to the substrate in the first treating block, and a second treatment is performed to the substrate in the second treating block. Thereafter, the substrate passes through the first treating block and is returned to the ID block 202. Such transportation of the substrate passing through the first treating block may cause reduction in throughput of the first treating block. Such transportation may also cause reduction in throughput of the substrate treating apparatus 201 entirely.

The present invention has been made regarding the state of the art noted above, and its object is to provide a substrate treating system and a substrate transporting method capable of suppressed decrease in throughput.

Solution to Problem

To achieve the object, the present invention provides a configuration as follows. One aspect of the present invention provides a substrate treating system including an indexer block where a carrier platform for placing a carrier capable of accommodating substrates is provided, a first treating device, and a second treating device. The first treating device, the indexer block, and the second treating device are linearly connected in this order in a horizontal direction. The indexer block includes a substrate buffer for placing the substrates, the substrate buffer being disposed in the middle of the first treating device and the second treating device. The indexer block takes a substrate from the carrier placed on the carrier platform, and transports the taken substrate to the substrate buffer. The first treating device receives the substrate from the substrate buffer, performs a predetermined treatment on the received substrate, and transports the substrate treated in the first treating device to the substrate buffer. The second treating device receives the substrate, transported to the substrate buffer by the first treating device, from the substrate buffer, performs a predetermined treatment on the received substrate, and transports the substrate treated in the second treating device to the substrate buffer. The indexer block returns the substrate treated in the second treating device from the substrate buffer to the carrier placed on the carrier platform.

With the substrate treating system according to the present invention, reduction in throughput is suppressible. For instance, it is assumed as in FIG. 1 that the indexer block, the first treating device, and the second treating device are arranged in this order. In this case, in order to transport the substrate treated in the second treating device to the indexer block, the substrate is necessarily sent through the first treating device without any treatment by the first treating device. However, in the substrate treating system according to the present invention, the first treating device and the second treating device are both connected to the indexer block. Therefore, transportation of the substrate is performable directly from the second treating device to the indexer block without through the first treating device. Therefore, reduction in throughput is suppressible. Further, the substrate buffer is disposed in the middle of the two treating devices. Therefore, transportation of the substrate is performable from the first treating device to the second treating device through the substrate buffer. Such substrate transportation without using the indexer block achieves reduction in burden of the substrate transportation by the indexer block. Therefore, enhanced throughput is obtainable.

Moreover, the substrate treating system described above is preferably configured as under. The first treating device includes a first treating block for performing a first treatment on a substrate. The second treating device includes a second treating block for performing a second treatment on a substrate. The first treating block, the indexer block, and the second treating block are linearly connected in this order in the horizontal direction. The indexer block takes a substrate from the carrier placed on the carrier platform, and transports the taken substrate to the substrate buffer. The first treating block receives the substrate from the substrate buffer, performs the first treatment on the received substrate, and transports the substrate, subjected to the first treatment, to the substrate buffer. The second treating block receives the substrate, transported to the substrate buffer by the first treating block, from the substrate buffer, performs the second treatment on the received substrate, and transports the substrate, subjected to the second treatment, to the substrate buffer. The indexer block returns the substrate, subjected to the second treatment, from the substrate buffer to the carrier placed on the carrier platform.

For instance, it is assumed that the indexer block, the first treating block, and the second treating block are arranged in this order. In this case, in order to transport the substrate treated in the second treating block to the indexer block, the substrate is necessarily sent through the first treating block without any treatment in the first treating block. However, both the first treating block and the second treating block are connected to the indexer block. Therefore, transportation of the substrate is performable directly from the second treating block to the indexer block without through the first treating block. Therefore, reduction in throughput is suppressible. Further, the substrate buffer is disposed in the middle of the two treating blocks. Therefore, transportation of the substrate is performable from the first treating block to the second treating block through the substrate buffer. Such substrate transportation without using the indexer block achieves reduction in burden of the substrate transportation by the indexer block. Therefore, enhanced throughput is obtainable.

Moreover, the following is preferred in the substrate treating system described above. The indexer block further includes an indexer substrate transport mechanism provided therein. The indexer substrate transport mechanism takes a substrate from the carrier placed on the carrier platform, and transports the taken substrate to the substrate buffer. The indexer substrate transport mechanism receives the substrate, subjected to the second treatment, from the substrate buffer, and returns the received substrate to the carrier placed on the carrier platform.

Moreover, the substrate treating system described above is preferably configured as under. The second treating device includes a second treating block and an interface block. The second treating block is connected to the indexer block, and performs a second treatment on the substrate. The interface block is connected to the second treating block, and is configured to load and unload a substrate into and from an external device. The second treating block receives the substrate, transported to the substrate buffer by the first treating device, from the substrate buffer, and transports the received substrate to the interface block. The interface block unloads the substrate transported by the second treating block to the external device, and loads the substrate treated into the external device. The second treating block receives the substrate treated in the external device from the interface block, performs the second treatment on the received substrate, and transports the substrate, subjected to the second treatment, to the substrate buffer.

Thus, such a configuration where the interface block is connected to the second treating block achieves reduction in throughput. Further, the substrate buffer is disposed in the middle of the first treating device and the second treating block. Therefore, transportation of the substrate is performable from the first treating device to the second treating block through the substrate buffer. Such substrate transportation without using the indexer block achieves reduction in burden of the substrate transportation by the indexer block. Therefore, enhanced throughput is obtainable.

Moreover, the substrate treating system described above is preferably configured as under. The first treating device includes a first treating block and an interface block. The first treating block is connected to the indexer block, and performs a first treatment on the substrate. The interface block is connected to the first treating block, and is configured to load and unload a substrate into and from an external device. The first treating block receives the substrate from the substrate buffer, performs the first treatment on the received substrate, and transports the substrate subjected to the first treatment to the interface block. The interface block unloads the substrate transported by the first treating block to the external device, and loads the substrate treated into the external device. The first treating block receives the substrate treated in the external device from the interface block, and transports the received substrate to the substrate buffer.

Thus, such a configuration where the interface block is connected to the first treating block achieves reduction in throughput. Further, the substrate buffer is disposed in the middle of the first treating block and the second treating device. Therefore, transportation of the substrate is performable from the first treating block to the second treating device through the substrate buffer. Such substrate transportation without using the indexer block achieves reduction in burden of the substrate transportation by the indexer block. Therefore, enhanced throughput is obtainable.

Moreover, the substrate treating system described above is preferably configured as under. The first treating device includes a first treatment layer configured to perform a first treatment on the substrate, and a third treatment layer configured to perform a third treatment in a level different from a level of the first treatment layer. The indexer block takes a substrate from the carrier placed on the carrier platform, and transports the taken substrate to the substrate buffer so as for the third treatment layer to receive the substrate. The third treatment layer receives the substrate from the substrate buffer, and performs the third treatment on the received substrate. Further, the third treatment layer transports the substrate, subjected to the third treatment, to the substrate buffer. The indexer block moves the substrate, subjected to the third treatment, from the level of the third treatment layer to the level of the first treatment layer in the substrate buffer such that the first treatment layer enables reception of the substrate. The first treatment layer receives the substrate, subjected to the third treatment, from the substrate buffer, performs the first treatment on the received substrate, and transports the substrate, subjected to the first treatment, to the substrate buffer. The second treating device receives the substrate, transported to the substrate buffer by the first treatment layer, from the substrate buffer, performs a predetermined treatment on the received substrate, and transports the substrate treated in the second treating device to the substrate buffer.

Thus, both the first treating device (the first treatment layer and the third treatment layer) and the second treating device are connected to the indexer block. Therefore, reduction in throughput is suppressible Further, the substrate buffer is disposed in the middle of the first treatment layer and the second treating device. Therefore, transportation of the substrate is performable from the first treatment layer to the second treating device through the substrate buffer. Such substrate transportation without using the indexer block achieves reduction in burden of the substrate transportation by the indexer block. Therefore, enhanced throughput is obtainable.

Moreover, the substrate treating system described above is preferably configured as under. The second treating device includes a second treatment layer configured to perform a second treatment on the substrate, and a third treatment layer configured to perform a third treatment in a level different from a level of the second treatment layer. The second treatment layer receives the substrate, transported to the substrate buffer by the first treating device, from the substrate buffer, performs the second treatment on the received substrate, and transports the substrate, subjected to the second treatment, to the substrate buffer. The indexer block moves the substrate, subjected to the second treatment, from the level of the second treatment layer to the level of the third treatment layer in the substrate buffer such that the third treatment layer enables reception of the substrate. The third treatment layer receives the substrate, subjected to the second treatment, from the substrate buffer, performs the third treatment on the received substrate, and transports the substrate, subjected to the third treatment, to the substrate buffer. The indexer block returns the substrate treated in the third treatment layer from the substrate buffer to the carrier placed on the carrier platform.

Thus, both the first treating device and the second treating device (the second treatment layer and the third treatment layer) are connected to the indexer block. Therefore, reduction in throughput is suppressible. Further, the substrate buffer is disposed in the middle of the first treating device and the second treatment layer. Therefore, transportation of the substrate is performable from the first treating device to the second treatment layer through the substrate buffer. Such substrate transportation without using the indexer block achieves reduction in burden of the substrate transportation by the indexer block. Therefore, enhanced throughput is obtainable.

Moreover, the substrate treating system described above is preferably configured as under. The first treating device includes a first treating block connected to the indexer block, and an interface block connected to the first block. The interface block is configured to load and unload a substrate into and from an external device. The first treating block includes a first treatment layer configured to perform a first treatment on the substrate, and a third treatment layer configured to perform a third treatment in a level different from a level of the first treatment layer. The indexer block takes a substrate from a carrier placed on the carrier platform, and transports the taken substrate to the substrate buffer such that the third treatment layer enables reception of the substrate. The third treatment layer receives the substrate from the substrate buffer, performs the third treatment on the received substrate, and transports the substrate, subjected to the third treatment, to the substrate buffer. The indexer block moves the substrate, subjected to the third treatment, from the level of the third treatment layer to the level of the first treatment layer in the substrate buffer such that the first treatment layer enables reception of the substrate. The first treatment layer receives the substrate, subjected to the third treatment, from the substrate buffer, performs the first treatment on the received substrate, and transports the substrate subjected to the first treatment to the interface block. The interface block unloads the substrate transported by the first treatment layer to the external device, and loads the substrate treated into the external device. The first treatment layer receives the substrate treated in the external device from the interface block, and transports the received substrate to the substrate buffer. The second treating device receives the substrate, transported to the substrate buffer by the first treatment layer, from the substrate buffer, performs a predetermined treatment on the received substrate, and transports the substrate treated in the second treating device to the substrate buffer.

Moreover, the substrate treating system described above is preferably configured as under. The second treating device includes a second treating block connected to the indexer block, and an interface block connected to the second block. The interface block is configured to load and unload a substrate into and from an external device. The second treating block includes a second treatment layer configured to perform a second treatment on the substrate, and a third treatment layer configured to performing a third treatment in a level different from a level of the second treatment layer. The second treatment layer receives the substrate, transported to the substrate buffer by the first treating device, from the substrate buffer, performs the second treatment on the received substrate, and transports the substrate, subjected to the third treatment, to the interface block. The interface block unloads the substrate transported by the second treatment layer to the external device, and loads the substrate treated into the external device. The second treatment layer receives the substrate treated in the external device from the interface block, and transports the received substrate to the substrate buffer. The indexer block moves the substrate, subjected to the second treatment, from the level of the second treatment layer to the level of the third treatment layer in the substrate buffer such that the third treatment layer enables reception of the substrate. The third treatment layer receives the substrate, subjected to the second treatment, from the substrate buffer, performs the third treatment on the received substrate, and transports the substrate, subjected to the third treatment, to the substrate buffer. The indexer block returns the substrate treated in the third treatment layer from the substrate buffer to the carrier placed on the carrier platform.

Moreover, the following is preferred in the substrate treating system described above. The substrate treating system further includes a carrier storage shelf mounted on at least one of the indexer block, the first treating device, and the second treating device, and configured to store the carrier, and a carrier transport mechanism mounted on at least one of the indexer block, the first treating device, and the second treating device, and configured to transport the carrier between the carrier platform and the carrier storage shelf. For example, if a carrier storage shelf and a carrier transport mechanism are disposed on the side of the indexer block, the footprint of the substrate treating system increases because the carrier storage shelf and the carrier transport mechanism are disposed. In this regard, with the configuration of the present invention, the carrier storage shelf and the carrier transport mechanism overlap with at least one of the indexer block, the first treating block and the second treating block in plan view. As a result, suppressed increase in footprint of the substrate treating system is obtainable.

Another aspect of the present invention provides a substrate transporting method for a substrate treating system provided with an indexer block where a carrier platform for placing a carrier capable of accommodating substrates, a first treating device, and a second treating device. The substrate transporting method includes a first taking and transporting step of causing the indexer block to take a substrate from a carrier placed on the carrier platform and to transport the taken substrate to the substrate buffer provided inside the indexer block, a first treating and transporting step of causing the first treating device to receive the substrate from the substrate buffer, to perform a predetermined treatment on the received substrate, and to transport the substrate treated in the first treating device to the substrate buffer, a second treating and transporting step of causing the second treating device to receive the substrate, transported to the substrate buffer by the first treating device, from the substrate buffer, to perform a predetermined treatment on the received substrate, and to transport the substrate treated in the second treating device to the substrate buffer, and a returning step of causing the indexer block to return the substrate treated in the second treating device to the carrier placed on the carrier platform from the substrate buffer. The first treating device, the indexer block, and the second treating device are linearly connected in this order in a horizontal direction. The substrate buffer is disposed in the middle of the first treating device and the second treating device, and is configured to place a plurality of substrates therein.

With the substrate transporting method of the substrate treating system according to the present invention, reduction in throughput is suppressible. For instance, it is assumed that the indexer block, the first treating device, and the second treating device are arranged in this order. In this case, in order to transport the substrate treated in the second treating device to the indexer block, the substrate is necessarily sent through the first treating device without any treatment by the first treating device. However, with the substrate transporting method of the substrate treating system, the first treating device and the second treating device are both connected to the indexer block. Therefore, transportation of the substrate is performable directly from the second treating device to the indexer block without through the first treating device. Therefore, reduction in throughput is suppressible. Further, the substrate buffer is disposed in the middle of the two treating devices. Therefore, transportation of the substrate is performable from the first treating device to the second treating device through the substrate buffer. Such substrate transportation without using the indexer block achieves reduction in burden of the substrate transportation by the indexer block. Therefore, enhanced throughput is obtainable.

Advantageous Effects of Invention

With the substrate treating system and the substrate transporting method according to the present invention, reduction in throughput suppressible.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIRST EMBODIMENT

Figure 1:
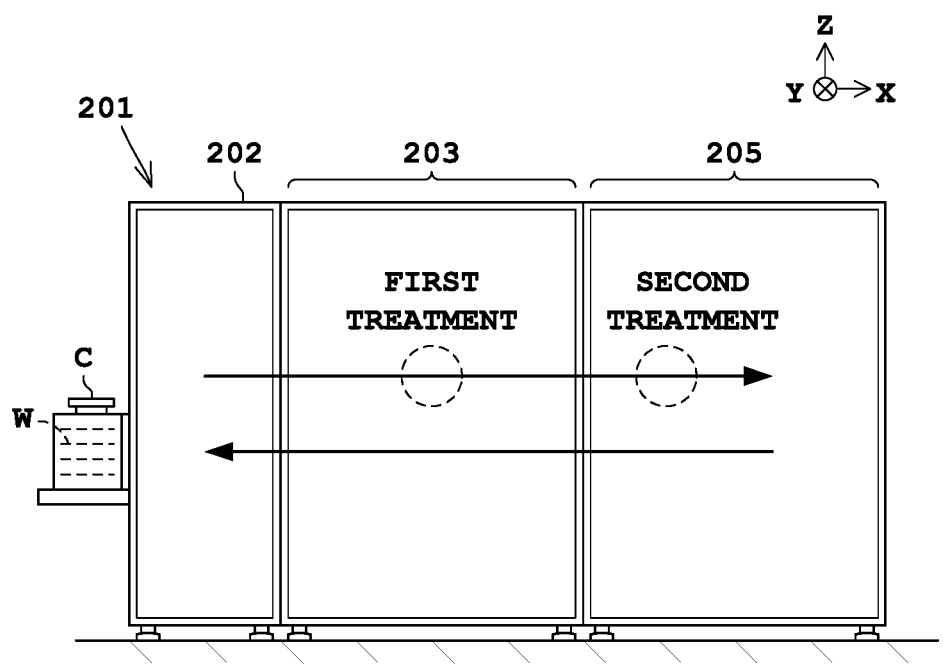
FIG. 1 illustrates a problem to be solved of the present invention.
Figure 2:
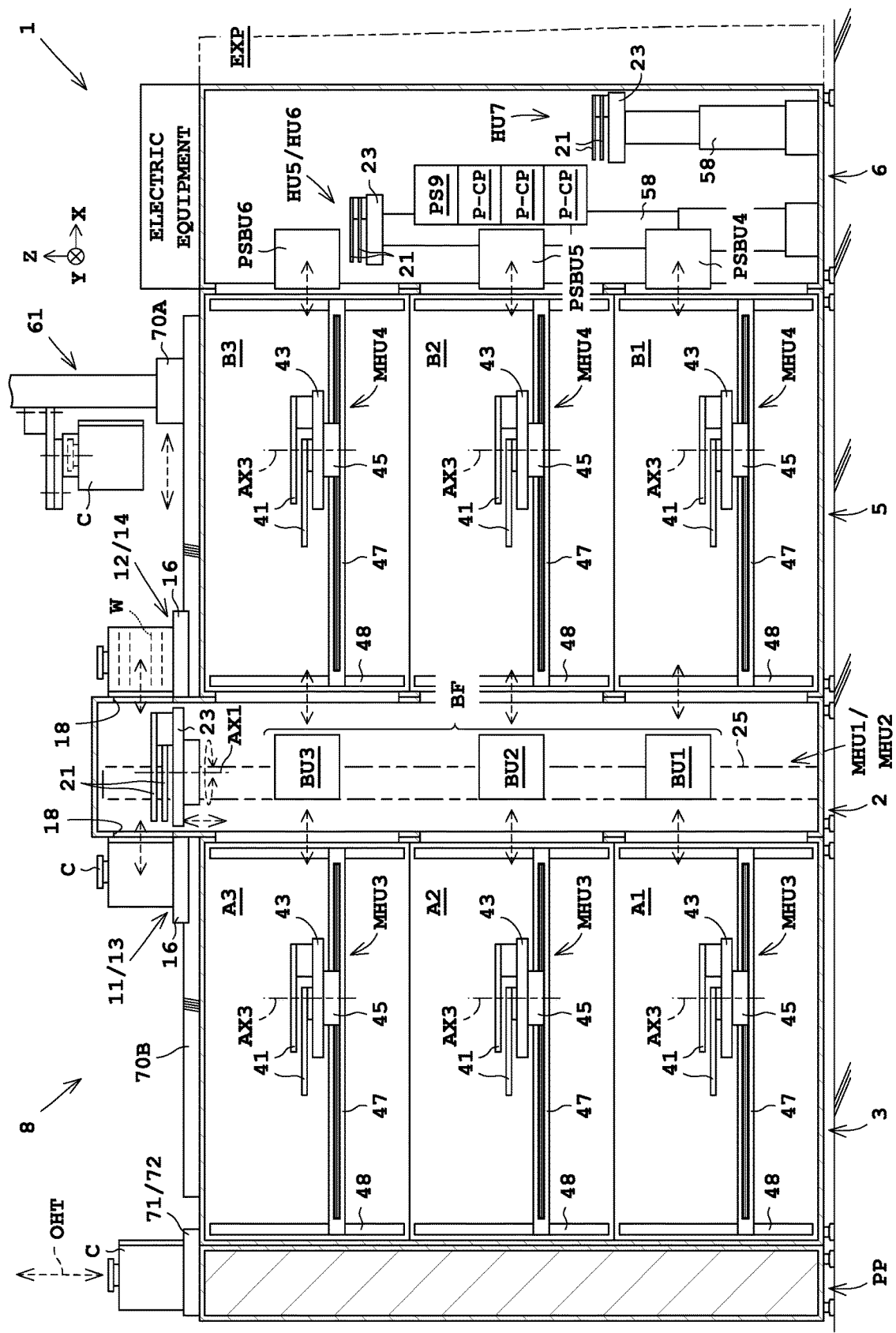
FIG. 2 is a longitudinal cross-sectional view of a substrate treating apparatus according to a first embodiment.
Figure 3:
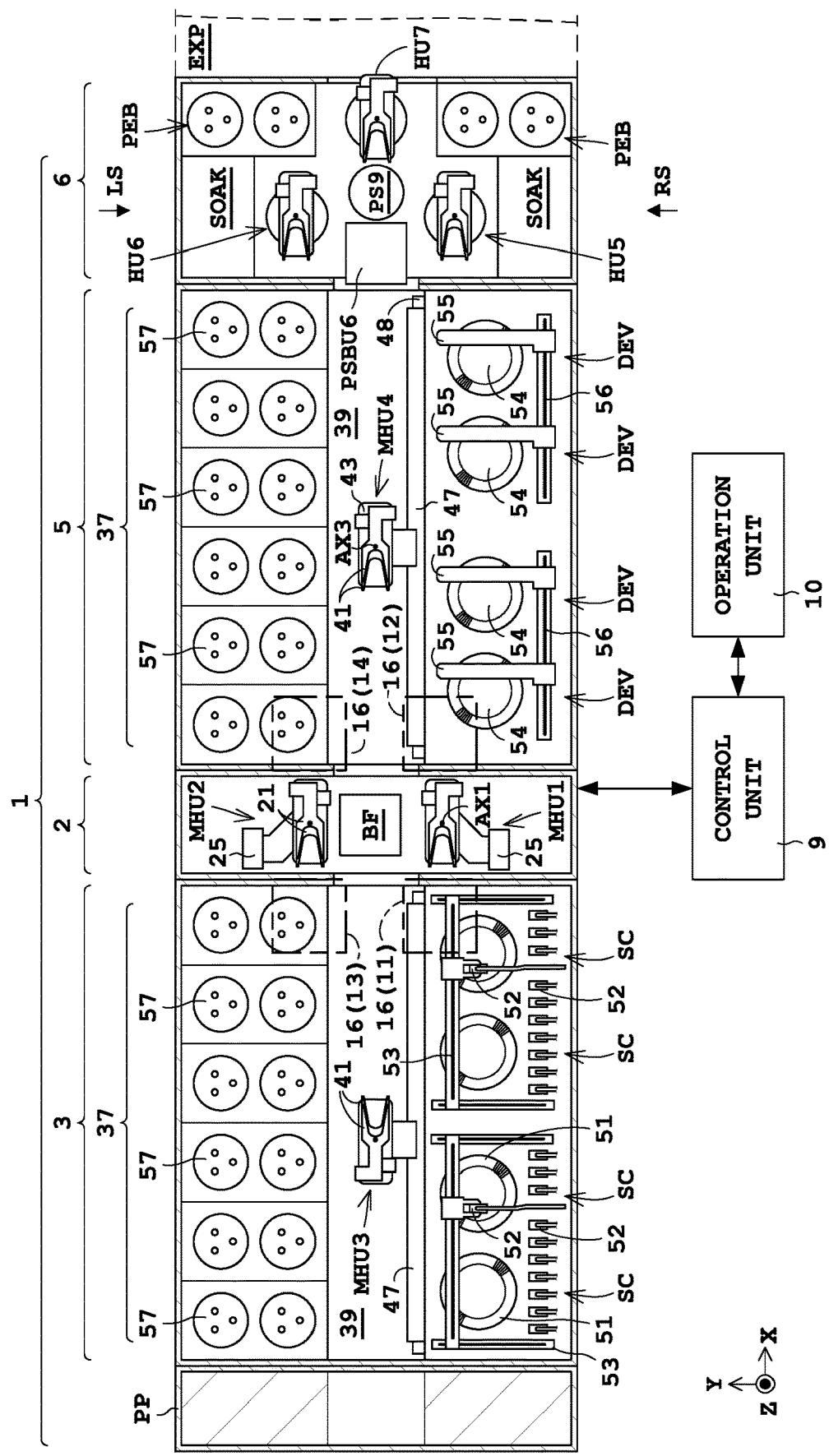
FIG. 3 is a horizontal cross-sectional view of the substrate treating apparatus according to the first embodiment.
Figure 4:
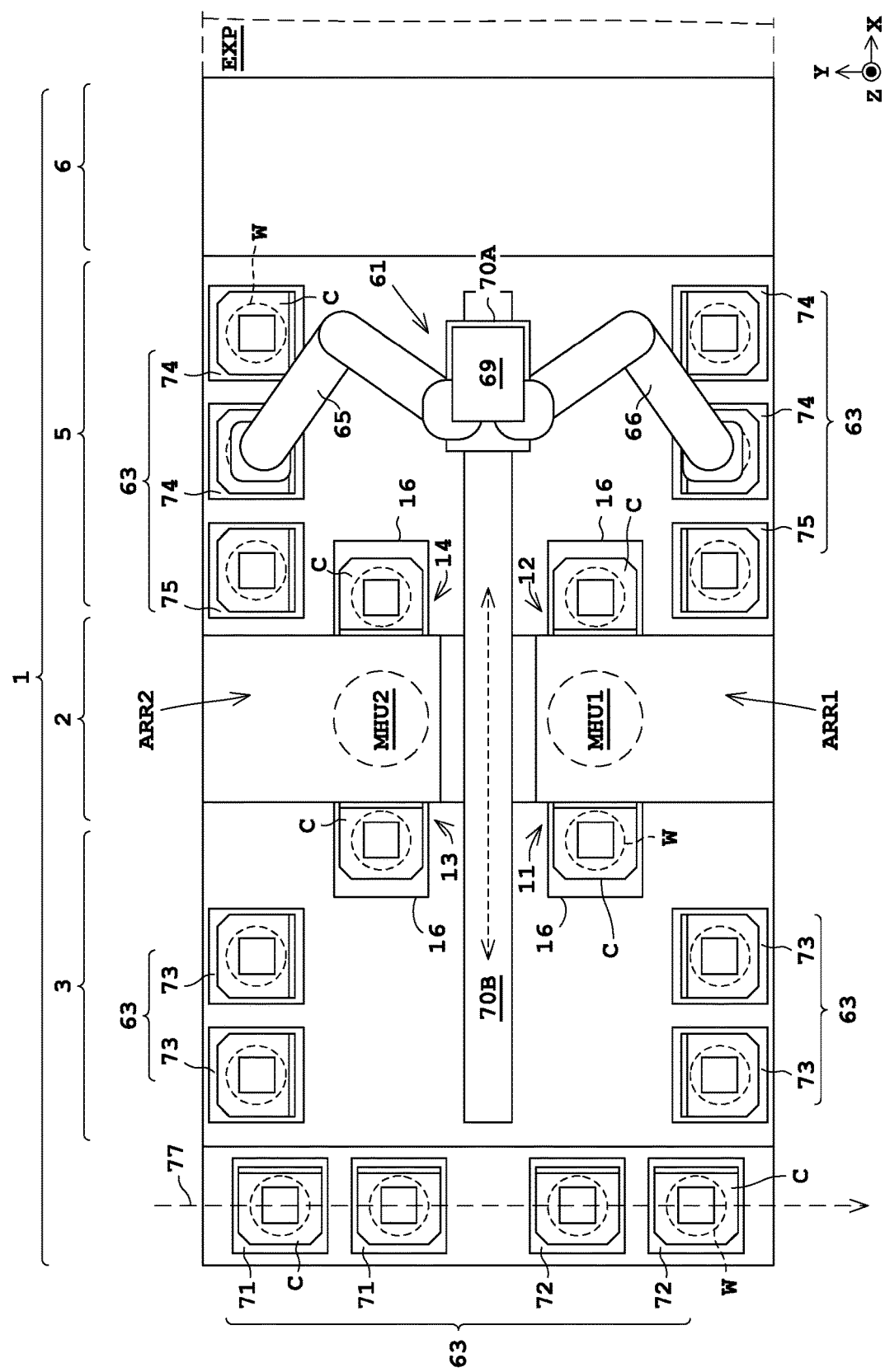
FIG. 4 is a plan view of the substrate treating apparatus according to the first embodiment.

A first embodiment of the present invention will now be described with reference to the drawings. FIG. 2 is a longitudinal cross-sectional view of a substrate treating apparatus according to a first embodiment. FIG. 3 is a horizontal cross-sectional view of the substrate treating apparatus according to the first embodiment. FIG. 4 is a plan view of the substrate treating apparatus according to the first embodiment.

Configuration of Substrate Treating Apparatus (Substrate Treating System) 1

Reference is made to FIGS. 2 and 3. The substrate treating apparatus 1 includes an ID block (indexer block) 2, a first treating block 3, a second treating block 5, an IF block (interface block) 6, and a carrier buffer device 8. The first treating block 3, the ID block 2, the second treating block 5, and the IF block 6 are linearly connected in a horizontal direction in this order. Specifically, the first treating block 3 is connected to the ID block 2 in the horizontal direction (X direction) with respect to the ID block 2. The second treating block 5 is disposed on the opposite side of the first treating block 3 across the ID block 2, and is connected to the ID block 2. The IF block 6 is disposed on the opposite side of the ID block 2 across the second treating block 5, and is connected to the second treating block 5. Here in FIGS. 2 and 3, reference numeral PP denotes, for example, a housing unit for accommodating pipes and electrical wires. Each of the pipes is used for sending a treating liquid. In addition, in this embodiment, the first treating block 3 corresponds to the first treating device of the present invention. The second treating block 5 and the IF block 6 correspond to the second treating device of the present invention.

Moreover, as shown in FIG. 3, the substrate treating apparatus 1 includes a control unit 9 and an operation unit 10. The control unit 9 includes, for example, a central processing unit (CPU). The control unit 9 controls components of the substrate treating apparatus 1. The operation unit 10 includes a display unit (e.g., liquid crystal monitor), a memory unit, and an input unit. The memory unit includes, for example, at least one of a read-only memory (ROM), random-access memory (RAM), and a hard disk. The input unit includes at least one of a keyboard, a mouse, a touch panel, and various buttons. The memory unit stores conditions for substrate treatments and operation programs necessary for controlling the substrate treating apparatus 1.

(1-1) Configuration of ID Block 2

The ID block 2 includes four openers (carrier mount tables) 11 to 14, two substrate transport mechanisms (robots) MHU1, MHU2, and a single substrate buffer BF, as shown in FIGS. 3 and 4. The two substrate transport mechanisms MHU1, MHU2, and the substrate buffer BF are disposed inside the ID block 2. Each of the two substrate transport mechanisms MHU1, MHU2 corresponds to the indexer substrate transport mechanism of the present invention.

(1-1-1) Configuration of Openers 11 to 14, etc.

The four openers 11 to 14 are provided on an outer wall of the ID block 2. The two openers 11, 12 are disposed around the first substrate transport mechanism MHU1 such that the first substrate transport mechanism MHU1 enables loading and unloading of the substrate W into and from the carrier C. In FIGS. 3 and 4, the two openers 11, 12 are arranged in a forward/rearward direction (X direction) across the substrate transport mechanism MHU1. Similar to the two openers 11, 12, the two openers 13, 14 are disposed around the second substrate transport mechanism MHU2 such that the second substrate transport mechanism MHU2 enables loading and unloading the substrate W into and from the carrier C. The two openers 13, 14 are arranged in the forward/rearward direction across the second substrate transport mechanism MHU2.

Each of the four openers 11 to 14 includes a platform 16, an opening 18, a shutter member (not shown), and a shutter driving mechanism (not shown), as shown in FIG. 2. The platform 16 is used to place the carrier C thereon.

The carrier C enables accommodation of a plurality (e.g., 25) of substrate W in horizontal orientation. In the carrier C, the plurality of substrates W are arranged in a vertical direction (Z direction). A gap is provided between two adjacent substrates W. For instance, a FOUP (Front Open Unified Pod) is used as the carrier C. Alternatively, a container except the FOUP (e.g., a Standard Mechanical Inter Face (SMIF) pod) is usable. The carrier C includes, for example, a carrier body with which an opening for taking in and out the substrate W is provided, and a lid for closing the opening. The substrates W are housed in the carrier body. The platform 16 corresponds to the carrier platform of the present invention.

The opening 18 is used to pass the substrate W. The shutter member is configured to open and close the opening 18 and to attach and detach the lid to and from the carrier body of the carrier C. The shutter member driving unit includes an electric motor to drive the shutter member. After removing the lid from the carrier body, the shutter member is moved horizontally (Y direction) or downward (Z direction) along the opening 18, for example.

The platform 16 is disposed above the first treating block 3 and the second treating block 5. Specifically, the platforms 16 of the two openers 11, 13 are disposed above the first treating block 3. Further, the platforms 16 of the two openers 12, 14 are disposed above the second treating block 5. Here, the platforms 16 of the two openers 11, 13 may be provided on an upper surface or a roof of the first treating block 3. Further, the platforms 16 of the two openers 12, 14 may be provided on an upper surface or a roof of the second treating block 5.

(1-1-2) Configuration of Substrate Transport Mechanisms MHU1, MHU2

As shown in FIG. 3, the two substrate transport mechanisms MHU1, MHU2 are arranged across the substrate buffer BF in a direction (Y direction) perpendicular to the forward/rearward direction (X direction) in which the first treating block 3 and the second treating block 5 are arranged. The two substrate transport mechanisms MHU1, MHU2 each transport the substrate W into and out of the substrate buffers BF. Further, the first substrate transport mechanism MHU1 transports a substrate W between the carrier C placed on the platforms 16 of the two openers 11, 12, and the substrate buffer BF. The second substrate transport mechanism MHU2 transports a substrate W between the carriers C placed on the platforms 16 of the two openers 13, 14, and the substrate buffer BF.

Figure 5:
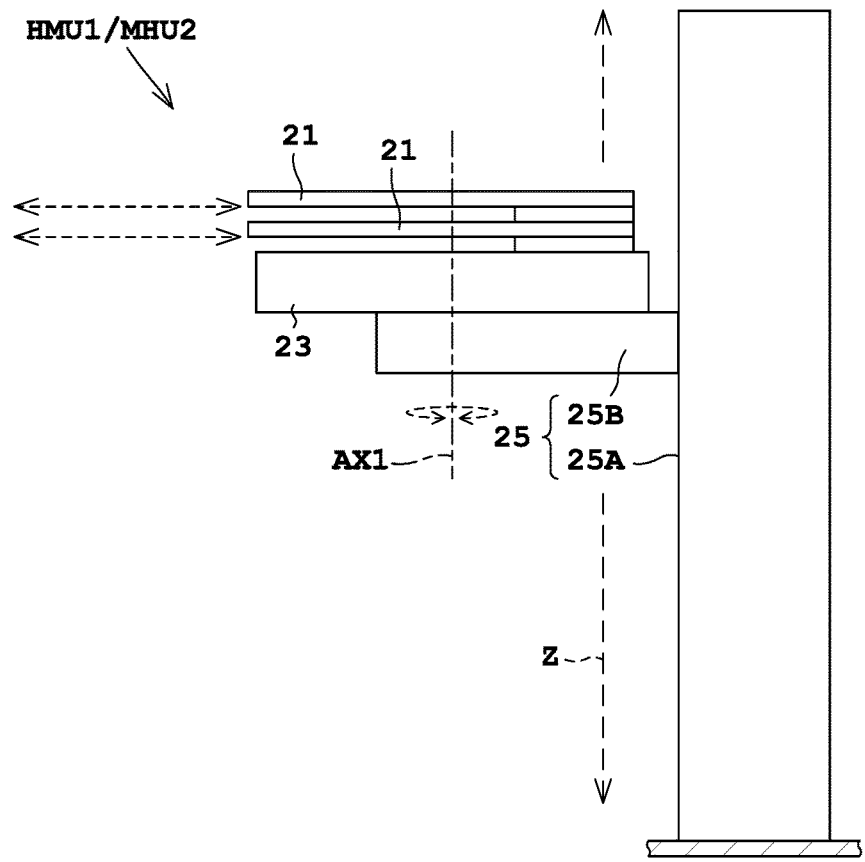
FIG. 5 illustrates a substrate transport mechanism of an indexer block.
Figure 6:
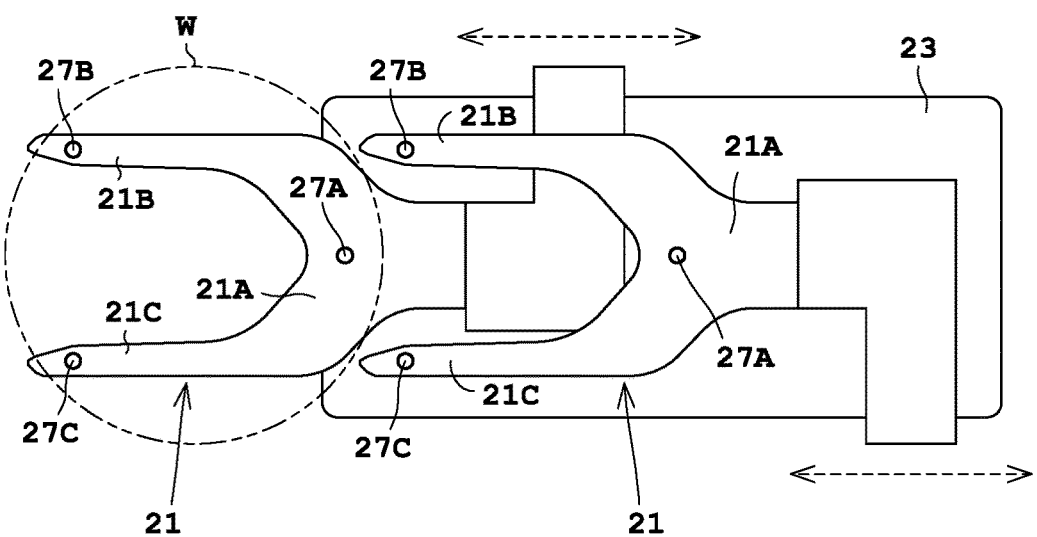
FIG. 6 is a plan view of two hands and a forward/rearward driving unit.

Reference is made to FIGS. 5 and 6. The two substrate transport mechanisms MHU1, MHU2 each includes two hands 21, a forward/rearward driving unit 23, and a lifting/lowering rotation driving unit 25. The two hands 21 each hold a substrate W. The two hands 21 are movable forward and backward in the horizontal direction individually. Therefore, this achieves taking of one substrate W from the carrier C, or taking of two substrates W at the same time.

As shown in FIG. 6, the hand 21 includes one basic part 21A, and two tip parts 21B, 21C branched from the basic part 21A. The hand 21 is formed in a Y-shape, a U-shape, or a two-pronged fork shape. Three suction portions 27A to 27C for holding a substrate W by sucking the substrate W are provided on the basic part 21A and the two tip parts 21B, 21C, respectively. Each of the three suction portions 27A to 27C is configured such that a suction force is applicable by a pump connected through a pipe, for example. Each of the two substrate transport mechanisms MHU1, MHU2 includes two hands 21, but may include three or more hands 21.

The forward/rearward driving unit 23 supports each of the hands 21 movably, and moves each of the hands 21 forward and backward. In order to drive one hand 21, the forward/rearward driving unit 23 includes, for example, an electric motor, a straight screw shaft, a movable member having a hole portion engaging with the screw shaft, and a guide unit for guiding the movable member.

The lifting/lowering rotation driving unit 25 lifts, lowers, and rotates the forward/rearward driving unit 23 to thereby lift, lower, and rotate the two hands 21. As shown in FIG. 5, the lifting/lowering rotation driving unit 25 includes a strut portion 25A and a rotating portion 25B. The strut portion 25A extends in the upward/downward direction. The strut portion 25A is fixed to the floor of the ID block 2. Accordingly, the position of the strut portion 25A (i.e., the lifting/lowering rotation driving unit 25) in the horizontal direction (XY direction) is fixed without being moved. The rotating portion 25B rotates the forward/rearward driving unit 23 about a vertical axis AX1. An electric motor causes the lifting/lowering rotation driving unit 25 to perform the lifting, lowering, and rotating.

(1-1-3) Configuration of Substrate Buffer BF

The substrate buffer BF places a plurality of substrates W thereon. As shown in FIG. 3, the substrate buffer BF is disposed in the middle (center) of the first treating block 3 and the second treating block 5. Thus, both the first treating block 3 and the second treating block 5 are capable of loading and unloading the substrate W with respect to the substrate buffer BF. The substrate buffer BF is provided with three buffer units BU1 to BU3, as shown in FIG. 2. The three buffer units BU1 to BU3 are arranged in a row in the vertical direction.

The first buffer unit BU1 is provided corresponding to the two treatment layers A1, B1. That is, the first buffer unit BU1 is provided in the same level (i.e., the first floor) as the first treatment layer A1 of the first treating block 3 and the first treatment layer B1 of the second treating block 5. Moreover, the second buffer unit BU2 is provided in the same level (i.e., the second floor) as the two treatment layers A2, B2, corresponding to the two treatment layers A2, B2. The third buffer unit BU3 is provided in the same level (i.e., the third floor) as the two treatment layers A3, B3, corresponding to the two treatment layers A3, B3.

Next, three buffer units BU1 to BU3 will be described with reference to FIG. 7. Each of the three buffer units BU1 to BU3 includes a plurality of (e.g., fifteen) substrate platforms 31. A plurality of substrate platforms 31 is arranged by gaps in a row in the vertical direction. In each of the three buffer units BU1 to BU3, the substrate platforms 31 are supported by four frames 33 extending in the vertical direction at the four corners.

Figure 7:
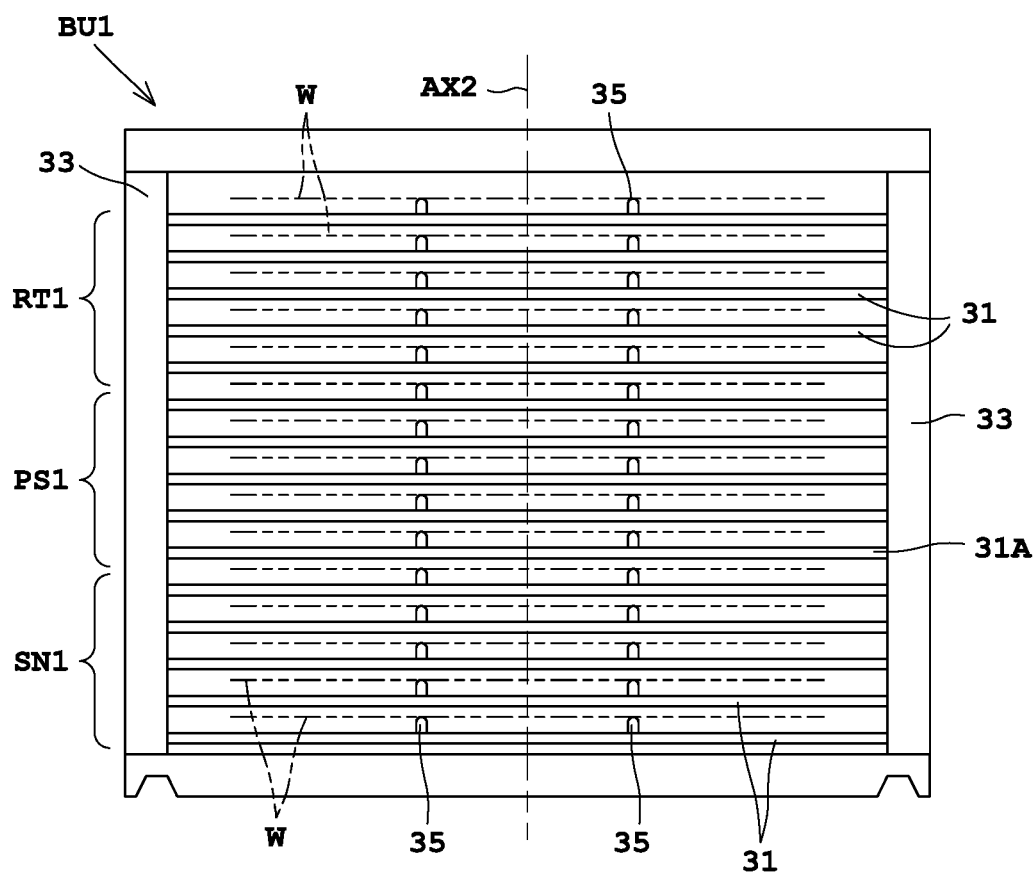
FIG. 7 illustrates a buffer unit.
Figure 8:
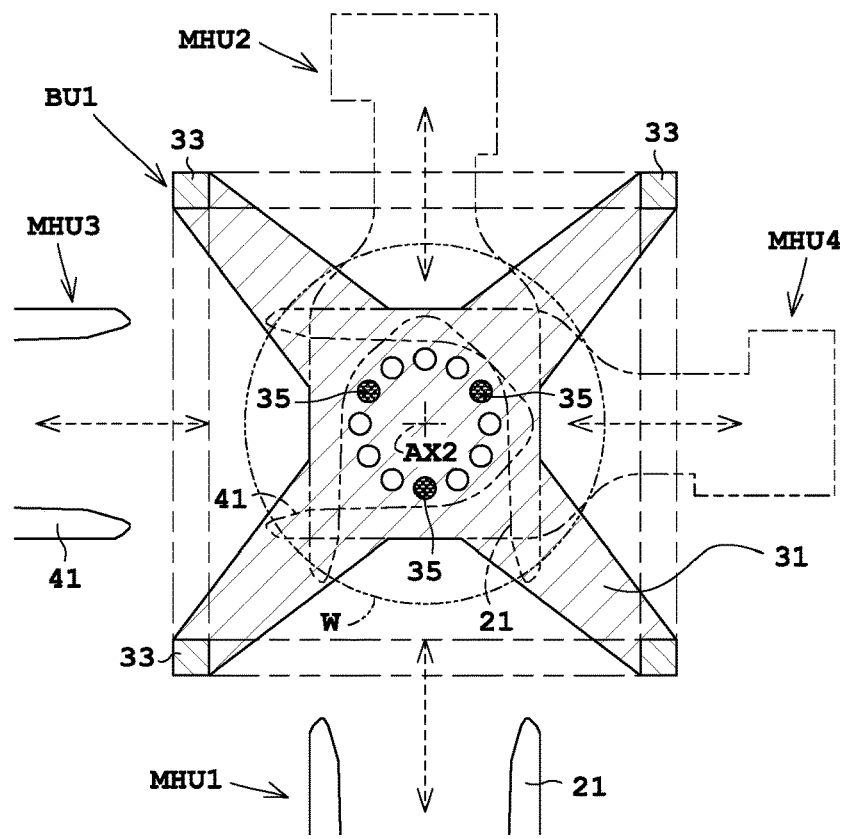
FIG. 8 illustrates a substrate platform.
Figure 9:
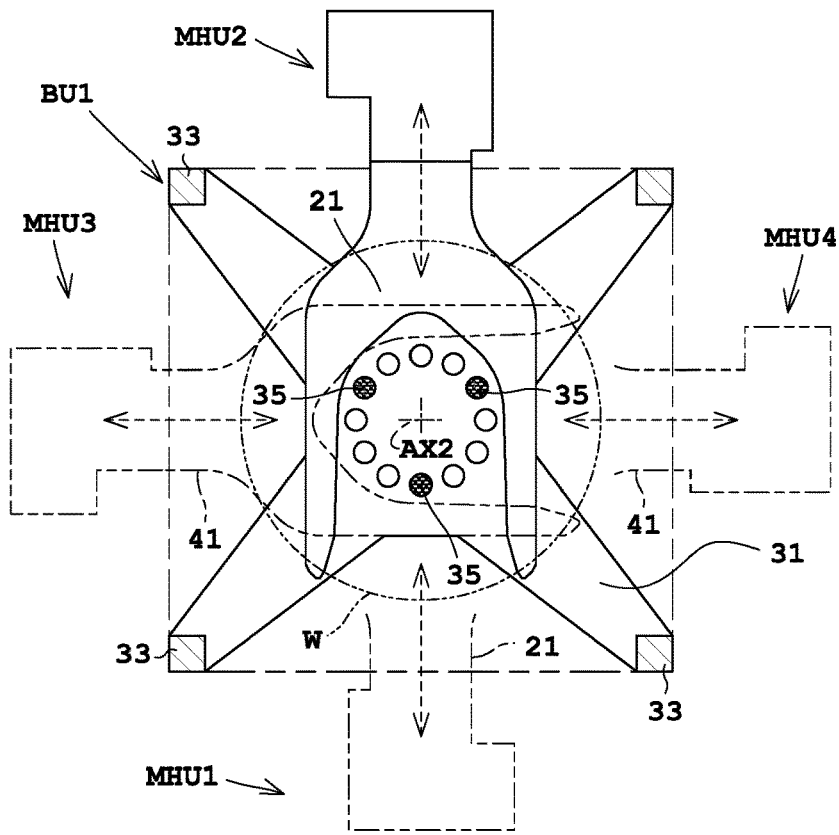
FIG. 9 illustrates capability of entering into the substrate platform in four directions.

As shown in FIG. 7, each of the substrate platforms 31 is formed in a thin plate shape in side view. As shown in FIG. 8, each of the substrate platforms 31 is formed in an X-shape in top view. Three support pins 35 for supporting one substrate W are provided in the central portion of each substrate platform 31, the central portion corresponding to a portion where the X-shaped substrate platforms 31 intersect. The three support pins 35 are spaced at equal intervals (in 120-degree intervals) about the vertical axis AX2. With such a construction, the hand 21 (41) enables entering into a space above the substrate platform 31 (i.e., a gap between two adjacent substrate platforms 31) from the four horizontal directions as shown in FIG. 9. Thus, in each of the four horizontal directions, the hand 21 (41) enables placing and taking of a substrate W on and from the three support pins 35.

Each hand 21 of the first substrate transport mechanism MHU1 approaches each of the substrate platforms 31 from the lower side of the paper plane of FIG. 9. Likewise, each hand 21 of the second substrate transport mechanism MHU2 approaches each substrate platform 31 from the upper side of the paper plane of FIG. 9. Each hand 41 of the first treating block 3 approaches each substrate platform 31 from the left side of the paper plane of FIG. 9. Each hand 41 of the second treating block 5 approaches each substrate platform 31 from the right side of the paper plane of FIG. 9. In order to prevent interference among the hands 21, 41, when one of the hands 21 (41) from a predetermined direction enters a space above a particular substrate platform 31, the other hands 21 (41) from the other three directions are configured not to enter the space above the particular substrate platform 31.

Also, the two substrate transport mechanisms MHU1, MHU2 and the two substrate transport mechanisms MHU3, MHU4 of the two treating blocks 3, 5, which will be described later, each enable placing and taking of a substrate W on and from all the substrate platforms 31 of the three buffer units BU1 to BU3. Thereby, the two substrate transport mechanisms MHU1, MHU2 and the two substrate transport mechanisms MHU3, MHU4 are configured so as to be capable of taking a substrate W placed on the substrate buffer BF (or a predetermined substrate platform 31).

The buffer unit BU1 includes fifteen substrate platforms 31. As shown in FIG. 7, the buffer unit BU1 includes a feed unit SN1, a transfer unit PS1, and a return unit RT1. The feed unit SN1, the transfer unit PS1 and the return unit RT1 are each constituted by five substrate platforms 31, for example. The buffer units BU2, BU3 are configured in the same manner as that of the buffer unit BU1. The buffer unit BU2 includes a feed unit SN2, a transfer unit PS2, and a return unit RT2. The buffer unit BU3 includes a feed unit SN3, a transfer unit PS3, and a return unit RT3.

(1-2) Configuration of Treating Blocks 3 and 5

Reference is made to FIGS. 2 and 3. The first treating block 3 includes three treatment layers A1 to A3. The three treatment layers A1 to A3 are arranged vertically so as to stack. The second treating block 5 includes three treatment layers B1 to B3. The three treatment layers B1 to B3 are arranged vertically so as to stack. The first treating block 3 (each of the treatment layers A1 to A3) performs a coating treatment as the first treatment, for example. The second treating blocks 5 (each of the treatment layers B1 to B3) performs a developing treatment as the second treatment, for example. That is, the second treating block 5 performs a treatment different from a treatment performed in the first treating block 3.

Each of the treatment layers A1 to A3 includes a third substrate transport mechanism MHU3, a plurality of coating units SC, a plurality of heat-treatment units 37, and a transportation space 39. Each of the treatment layers B1 to B3 includes a fourth substrate transport mechanism MHU4, a plurality of the developing units DEV, a plurality of heat-treatment units 37, and a transportation space 39. The transportation space 39 is configured to extend linearly in the X-direction. That is, the transportation space 39 is a longitudinal space in the X-direction. Each of substrate transport mechanisms MHU3, MHU4 is provided in the transportation space 39. The coating unit SC (or the developing unit DEV) and the heat-treatment unit 37 are arranged across the transportation space 39, and are arranged in the longitudinal direction of the transportation space 39.

(1-2-1) Configuration of Substrate Transport Mechanisms MHU3, MHU4

Each of the substrate transport mechanisms MHU3, MHU4 includes two hands 41, a forward/rearward driving unit 43, a rotation driving unit 45, a first movement mechanism 47, and a second movement mechanism 48. The two hands 41, the forward/rearward driving unit 43, and the rotation driving unit 45 are configured in the same manner as that of the two hands 21, the forward/rearward driving unit 23 and the rotating portion 25B of the first substrate transport mechanism MHU1, respectively, for example. That is, each of the two hands 41 holds a substrate W. Each of the two hands 41 has one basic part and two tip parts branched from the basic part. Three suction portions for holding a substrate W by sucking the substrate W are each provided on the basic part and the two tip parts, respectively.

Moreover, each of the two hands 41 is movably attached to the forward/rearward driving unit 43. The forward/rearward driving unit 43 moves the two hands 41 forward and backward individually. The rotation driving unit 45 rotates the forward/rearward driving unit 43 about the vertical axis AX3. This achieves variation in direction of the two hands 41. The first movement mechanism 47 enables the rotation driving unit 45 to move in the forward/rearward direction (X direction) of FIG. 2. The second movement mechanism 48 enables the first movement mechanism 47 to move in the vertical direction (Z direction) of FIG. 2. The two movement mechanisms 47, 48 enable the two hands 41 and the forward/rearward driving unit 43 to move in the X and Z directions.

The forward/rearward driving unit 43, the rotation driving unit 45, the first movement mechanism 47, and the second movement mechanism 48 each include an electric motor.

(1-2-2) Configuration of Coating Unit SC and Developing Unit DEV

Figure 10:
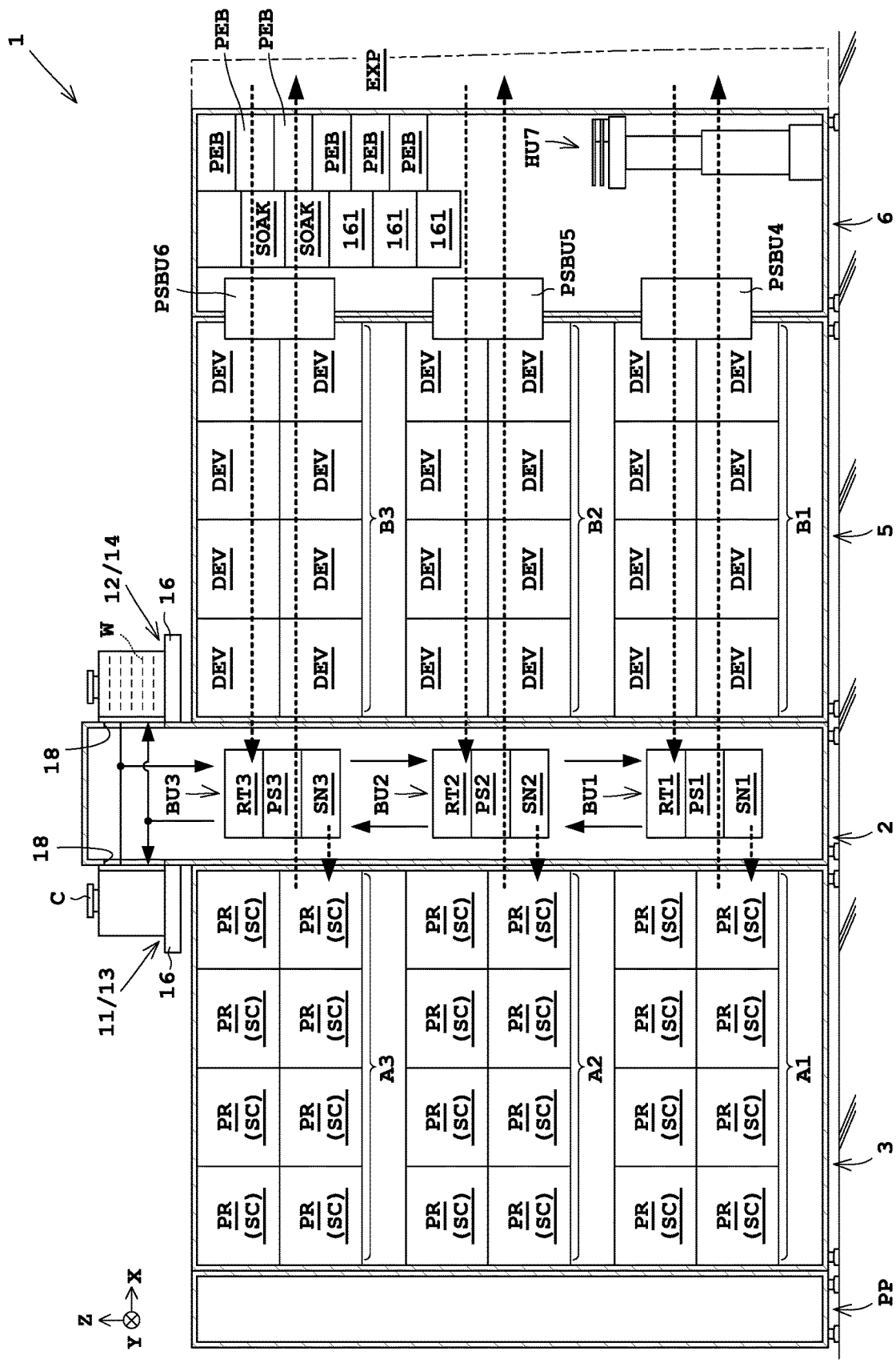
FIG. 10 is a right side view of the substrate treating apparatus according to the first embodiment.

FIG. 10 is a right side view of the substrate treating apparatus 1. The treatment layers A1 to A3 each include eight coating units SC. The eight coating units SC are arranged in two levels in the vertical direction and four lines in the horizontal direction. Further, the coating unit SC is a coating unit PR for applying a photoresist in FIG. 10. Also, the three treatment layers B1 to B3 each include eight developing units DEV. The eight developing units DEV are arranged in two levels and four lines. The number of the coating units SC and the developing units DEV are variable appropriately.

As shown in FIG. 3, the coating units SC each include a holding rotation portion 51 nozzles 52, and a nozzle moving mechanism 53. The holding rotation portion 51 holds the lower surface of a substrate W by, for example, vacuum adsorption, and rotates the held substrate W around the vertical axis (Z direction). The nozzles 52 dispense the coating liquid (e.g., photoresist liquid) to the substrate W. Each of the nozzles 52 is connected to a coating liquid supply source via a pipe. A pump and an on-off valve are provided on the pipe. The nozzle moving mechanism 53 moves the nozzles 52 to any position. The holding rotation portion 51 and the nozzle moving mechanism 53 each include an electric motor, for example.

The developing units DEV also include a holding rotation portion 54, nozzles 55, and a nozzle moving mechanism 56, as shown in FIG. 3. The holding rotation portion 54 holds the lower surface of a substrate W by, for example, vacuum adsorption, and rotates the held substrate W around the vertical axis (Z direction). The nozzles 55 dispense the developer to the substrate W. Each of the nozzles 55 is connected to a developer supply source through a pipe. A pump and an on-off valve are provided on the pipe. The nozzle moving mechanism 56 is configured to move the nozzles 55 to any positions. The holding rotation portion 54 and the nozzle moving mechanism 56 each include an electric motor, for example.

(1-2-3) Configuration of Heat-Treatment Unit 37

Figure 11:
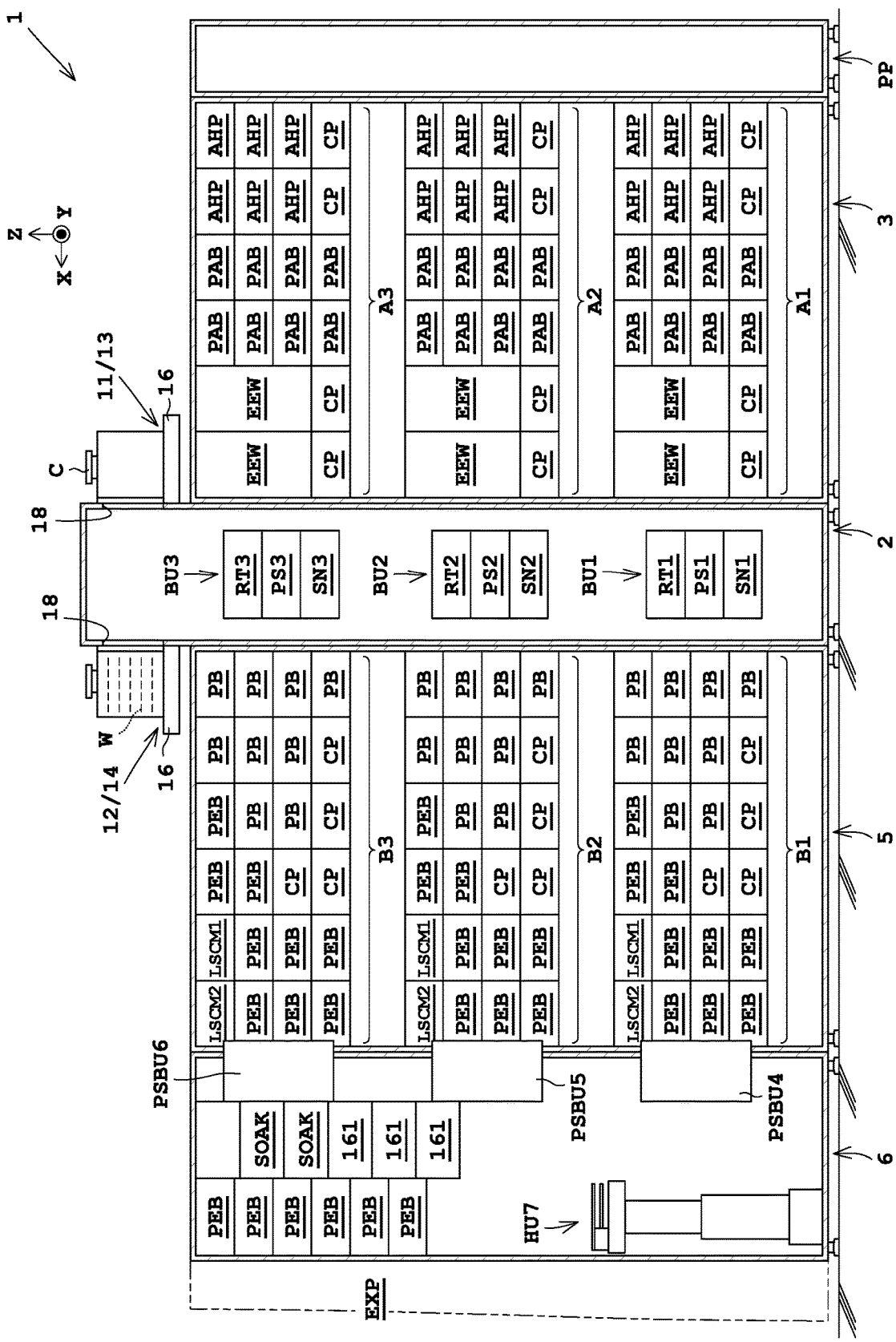
FIG. 11 is a left side view of the substrate treating apparatus according to the first embodiment.

FIG. 11 is a left side view of the substrate treating apparatus 1. Each of the three treatment layers A1 to A3 may include twenty-four heat-treatment units 37. In this case, twenty-four heat-treatment units 37 may be arranged in four levels and six lines. Similarly, each of the three treatment layers B1 to B3 may include twenty-four heat-treatment units 37. In this case, twenty-four heat-treatment units 37 may be arranged in four levels and six lines.

The heat-treatment units 37 each include a plate 57 for placing a substrate W in order to perform heat treatment on the substrate W (see FIG. 3). When heating the plate 57, the heat-treatment unit 37 includes a heater, for example. When cooling the plate 57, the heat-treatment unit 37 includes a water-cooled circulation mechanism, for example.

In FIG. 11, each of the treatment layers A1 to A3 includes six adhesion enhancing treatment units AHP, four cooling units CP, two edge exposing units EEW, and eight heat-treatment units PAB. Further, each of the treatment layers B1 to B3 includes four cooling units CP, nine heat-treatment units POSTBake (shown as "PB" in FIG. 11), two inspection units LSCM1, LSCM2, and nine post-exposure bake treatment units PEB. The adhesion enhancing treatment units AHP are configured to apply an adhesion enhancing agent such as hexamethyldisilazane (HMDS) to substrates W, and heats the resulting substrates W. The cooling units CP cool the substrates W. The edge exposing units EEW expose a periphery edge of a substrate W. The heat-treatment units PAB perform a bake treatment on the substrate W after coating. The heat treatment units POSTBake perform a bake treatment on the substrate W after the developing treatment. The post-exposure bake processing units PEB perform a bake treatment on the substrate W after exposure. The inspection unit LSCM1 inspects the coating film using a CCD-camera or an image sensor. The inspection unit LSCM2 inspects the substrate W after the developing treatment using a CCD camera or an image sensor. Adhesion enhancing treatment units AHP, the heat-treatment units PAB, the post-exposure bake treatment units PEB, and the heat-treatment units POSTBake each include a local substrate transport mechanism having a cooling function. The number and type of heat-treatment units 37 are variable appropriately.

(1-3) Configuration of IF Block 6

The IF block 6 is connected to the second treating block 5. The IF block 6 is configured to load and unload a substrate W into and from the exposure device EXP. The exposure device EXP is an external device. As shown in FIGS. 2, 3, 10, and 11, the IF block 6 includes three substrate transport mechanism HU5 to HU7, pre-exposure cleaning units 161, post-exposure cleaning units SOAK, post-exposure bake treatment units PEB, buffer units PSBU4 to PSBU6, mounting-cum-cooling units P-CP, and a substrate platform PS9.

The cleaning units 161, SOAK each include a holding rotation portion for holding a substrate W, and a nozzle for dispensing a cleaning liquid to the substrate W, for example. Further, the pre-treatment cleaning unit 161 may perform polishing to a back face and an edge (bevel portion) of a substrate W with use of a brush and the like. Here, the back face of the substrate W is a face opposite to the face where circuit patterns are formed, for example. Each of the buffer units PSBU4 to PSBU6 enables placement of a plurality of substrates W thereon.

As shown in FIG. 3, the two substrate transport mechanisms HU5, HU6 are arranged side by side in the Y direction perpendicular to the X direction. The two substrate transport mechanisms HU5, HU6 are arranged across the buffer units PSBU4 to PSBU6 capable of placing a plurality of substrates W thereon. The seventh substrate transport mechanism HU7 is disposed on the opposite side of the second treating blocks 5 across the two substrate transport mechanisms HU5, HU6. That is, two substrate transport mechanisms HU5, HU6 are disposed between the seventh substrate transport mechanism HU7 and the second treating blocks 5. A plurality of mounting-cum-cooling units P-CP and a substrate platform PS9 are surrounded by the three substrate transport mechanisms HU5 to HU7. The plurality of mounting-cum-cooling units P-CP and the substrate platform PS9 are arranged vertically. The substrate platform PS9 is configured to place a plurality of substrates W thereon.

The fifth substrate transport mechanism HU5 transports a substrate W among the pre-exposure cleaning units 161 (see an arrow RS side in FIG. 3, and also see FIG. 10), the post-exposure cleaning units SOAK (the arrow RS side), the post-exposure bake treatment units PEB (the arrow RS side), the buffer units PSBU4 to PSBU6, the mounting-cum-cooling units P-CP, and the substrate platform PS9. The sixth substrate transport mechanism HU6 transports a substrate W among the pre-exposure cleaning units 161 (see an arrow LS side in FIG. 3, and FIG. 11), the post-exposure cleaning units SOAK (the arrow LS side), the post-exposure bake treatment units PEB (the arrow LS side), the buffer units PSBU4 to PSBU6, the mounting-cum-cooling units P-CP, and the substrate platform PS9. The seventh substrate transport mechanism HU7 transports a substrate W among the exposure device EXP, the mounting-cum-cooling units P-CP, and the substrate platform PS9.

Each of the three substrate transport mechanisms HU5 to HU7 includes hands 21, a forward/rearward driving unit 23, and a lifting/lowering rotation driving unit 58. The hands 21 and the forward/rearward driving unit 23 are configured in the same manner as that of the hands 21 and the forward/rearward driving unit 23 of the substrate transport mechanism MHU1, for example. The lifting/lowering rotation driving unit 58 includes an electric motor. The lifting/lowering rotation driving unit 58 raises and lowers the hands 21 and the forward/rearward driving unit 23, and rotates the hands 21 and the forward/rearward driving unit 23 about the vertical axis.

(1-4) Configuration of Carrier Buffer Device 8

The carrier buffer device 8 includes a carrier transport mechanism 61, and carrier storage shelves 63 as shown in FIGS. 2 and 4. The carrier transport mechanism 61 and the carrier storage shelves 63 (i.e., carrier buffer device 8) are mounted on the ID block 2 and the two treating blocks 3, 5. The carrier transport mechanism 61 transports a carrier C between the platform 16 of each of the four openers 11 to 14 and the carrier storage shelves 63. The carrier storage shelves 63 each store the carrier C. Each of the carrier transport mechanism 61 and the carrier storage shelves 63 may be mounted on at least one of the ID block 2 and the two treating blocks 3, 5. Also, each of the carrier transport mechanism 61 and the carrier storage shelves 63 may be mounted on the IF block 6.

Figure 12:
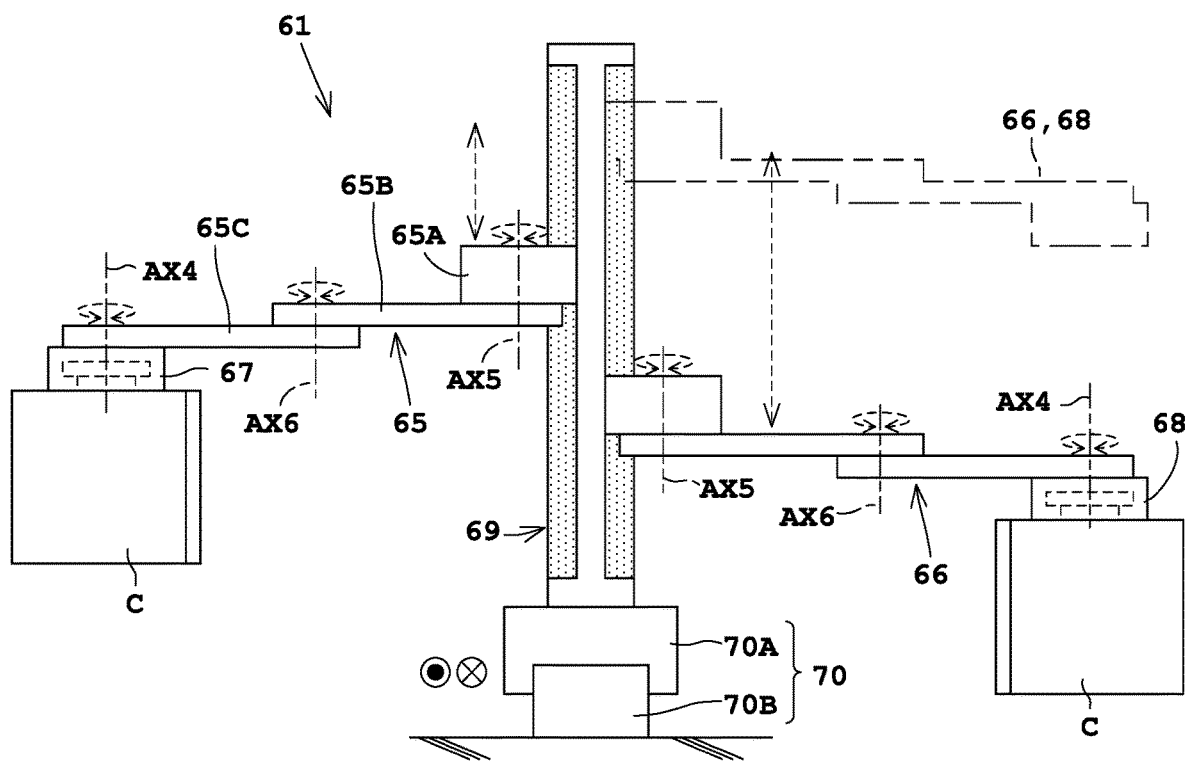
FIG. 12 illustrates a carrier transport mechanism.

Reference is made to FIG. 12. The carrier transport mechanism 61 includes two articulated arms 65, 66. A first articulated arm 65 includes a first end with a gripper 67, and a second articulated arm 66 includes a first end with a gripper 68. The first articulated arm 65 includes a second end supported on a strut lifting/lowering driving unit 69 so as to be movable in the upward/downward direction. The second articulated arm 66 includes a second end supported on the lifting/lowering driving unit 69 so as to be movable in the upward/downward direction.

Each of the two grippers 67, 68 is configured to grasp a projection provided on a top face of the carrier C, for example. The first articulated arm 65 is configured to allow gripper 67 to rotate 360 degrees about the vertical axis AX4. The first articulated arm 65 includes three arm members 65A to 65C, for example. The arm member 65A is supported on the lifting/lowering driving unit 69 to be described later so as to be movable upwardly/downwardly. The two arm members 65A, 65B are rotatably connected around a vertical axis AX5. Further, the two arm members 65B, 65C are rotatably connected around a vertical axis AX6. The second articulated arm 66 is configured in the same manner as that of the first articulated arm 65. The first articulated arm 65 may be in charge of transporting a carrier C on the upper side of the paper plane of FIG. 4, for example. The first articulated arm 66 may be in charge of transporting a carrier C on the lower side of the paper plane of FIG. 4, for example.

The lifting/lowering driving unit 69 is configured to allow the two articulated arms 65, 66 to be raised and lowered individually. Accordingly, the first articulated arm 65 may be moved to a position higher than that of the second articulated arm 66, or the first articulated arm 65 may be moved to a position lower than that of the second articulated arm 66. The lifting/lowering driving unit 69 may be configured to integrally raise and lower the two articulated arms 65, 66. Each of the two grippers 67, 68, the two articulated arms 65, 66 and the lifting/lowering driving unit 69 includes an electric motor.

A forward/backward driving unit 70 includes a supporting portion 70A for supporting the lifting/lowering driving unit 69, a longitudinal portion 70B extending longitudinally in the forward/rearward direction (X direction), and an electric motor. For instance, the longitudinal portion 70B may be a rail (guide rail) and the supporting portion 70A may be a carriage. In this case, the electric motor may be configured to cause the carriage (supporting portion 70A) to move along the rail (longitudinal portion 70B).

Moreover, the electric motor, a plurality of pulleys, a belt, and a guide rail may be accommodated in the longitudinal portion 70B, and the supporting portion 70A may be fixed to the belt, for example. In this case, the electric motor may cause the pulleys to rotate to move the belt on the pulleys, whereby supporting portion 70A is moved along the guide rail. Moreover, the electric motor, a screw shaft, and the guide rail may be accommodated in the longitudinal portion 70B, and a nut configured to engage with the screw shaft may be provided in the supporting portion 70A, for example. In this case, the electric motor may cause the screw shaft to rotate to move the supporting portion 70A along the guide rail.

Reference is made to FIG. 4. The carrier storage shelves 63 include input ports 71, output ports 72, untreated substrate carrier shelves 73, empty carrier shelves 74, and treated substrate carrier shelves 75. The input ports 71 are each a shelf for receiving a carrier C where untreated substrates W are accommodated from an external transport mechanism OHT (overhead hoist transport). The external transport mechanism OHT transports a carrier C in the factory. The term untreated means the condition where the substrate treating apparatus 1 performs no treatment in this embodiment. The two input ports 71 and the two output ports 72 are provided at one end in the longitudinal direction (X direction) of the roof of the substrate treating apparatus 1, as shown in FIG. 4. The two input ports 71 and the two output ports 72 are arranged in a lateral direction (Y direction) perpendicular to the longitudinal direction. Above the two input ports 71 and the two output ports 72, a rail 77 of the external transport mechanism OHT is provided. The external transport mechanism OHT transports a carrier C to one of the two input ports 71.

The untreated substrate carrier shelf 73 accommodates a carrier C which is placed on the input port 71, the carrier C being transported to neither of the platforms 16 of the openers 11, 12 and accommodating untreated substrates W. The empty carrier shelf 74 accommodates a carrier C from which all the substrates W are taken on the platform 16 of the opener 11, for example. The treated substrate carrier shelf 75 accommodates a carrier C accommodating treated substrates W and not capable of being transported to either of the two output ports 72. The term treated means the condition where the substrate treating apparatus 1 performs any treatment. The output ports 72 are each a shelf for delivering a carrier C where the treated substrates W are accommodated to the external transport mechanism OHT. The carrier transport mechanism 61 is capable of freely moving the carrier C between the platforms 16 and each of the shelves 71 to 75.

The carrier transport mechanism 61 includes the two articulated arms 65, 66 and two grippers 67, 68. Alternatively, one or three or more articulated arms, and one or three or more (the same number as the number of articulated arms) grippers may be provided. Further, the lifting/lowering driving unit 69 may be configured to be rotatable about a vertical axis (axis in the Z direction) with respect to the supporting portion 70A. Further, the rail 77 may be configured to pass over any location of the substrate treating apparatus 1. In this case, the input ports 71 and the output ports 72 are provided below rail 77. The number and types of the carrier storage shelves 63 are variable appropriately.

(2) Operation of Substrate Treating Apparatus 1

The following describes operation of the substrate treating apparatus 1. In this description, substrates W are treated in the two treatment layers A1, B1 in combination. The combination of the two treatment layers A2, B2 and the combination of the two treatment layers A3, B3 operate similarly to the combination of the two treatment layers A1, B1.

In FIG. 4, the two openers 11, 12 are used to take substrates W from a carrier C, and the remaining two openers 13, 14 are used to store substrates W in a carrier C.

Figure 13:
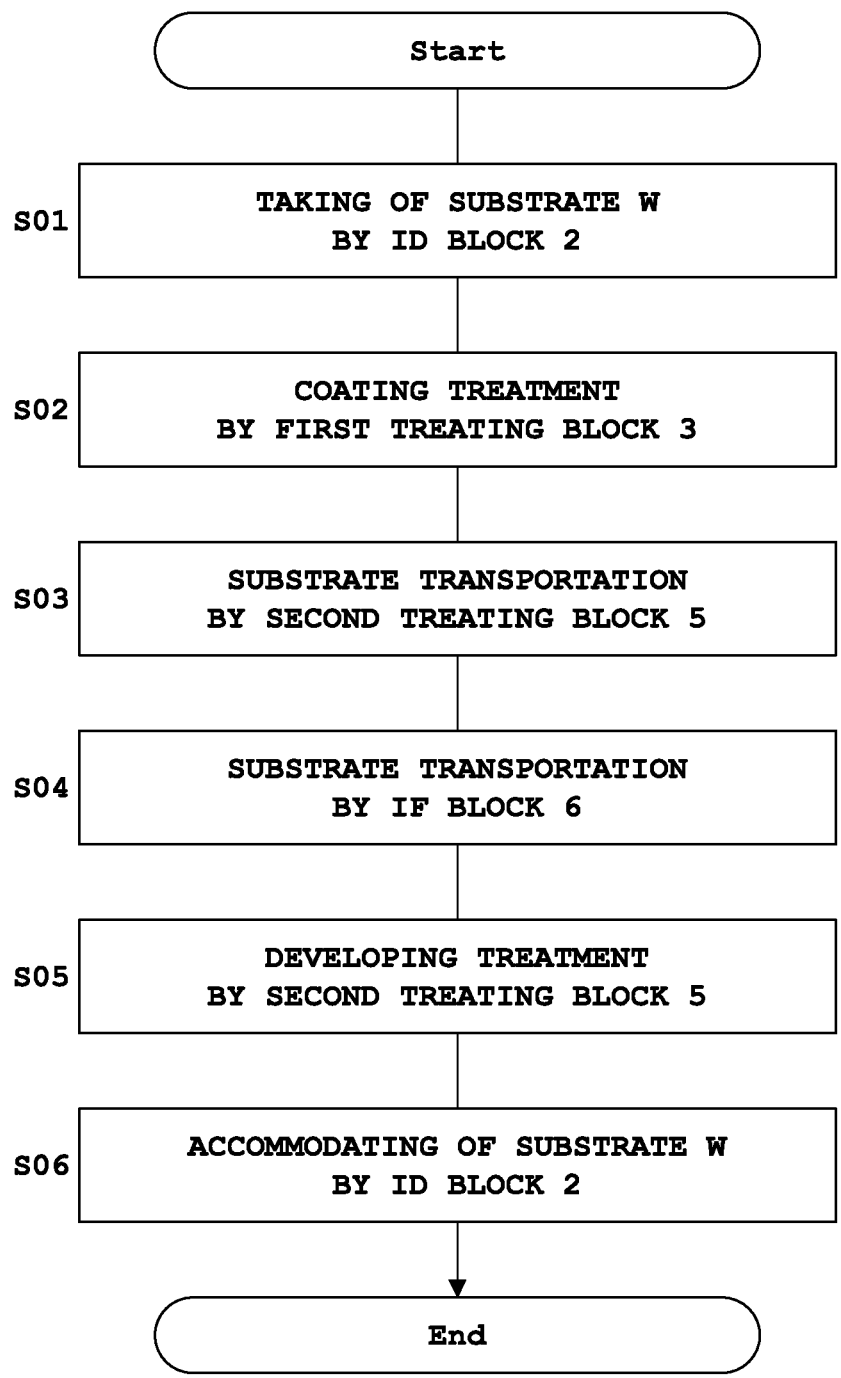
FIG. 13 is a flowchart illustrating operation of the substrate treating apparatus according to the first embodiment.

Further, FIG. 13 is a flowchart illustrating the operation of the substrate treating apparatus 1 according to the first embodiment.

Reference is made to FIGS. 2 and 4. The external transport mechanism OHT transports the carrier C to either of the two input ports 71. The carrier transport mechanism 61 transports the carrier C transported by the external transport mechanism OHT from the input port 71 to the platform 16 of either of the two openers 11, 12 (e.g., the opener 11). The shutter member of the opener 11 moves the lid while removing and holding the lid from the carrier C (carrier body). This releases the opening 18.

[Step S01] Taking of Substrate W by ID Block 2

The ID block 2 takes a substrate W from the carrier C placed on the platform 16 of the opener 11. The ID block 2 then enables the treatment layer A1 of the first treating block 3 to receive the substrates W.

Detailed description is as under. The first substrate transport mechanism MHU1 is configured to transport the substrate W to the openers 11, 12. The substrate transport mechanism MHU1 moves the hand 21 into the carrier C placed on the platform 16 of the opener 11 to take the substrate W from the carrier C. The substrate transport mechanism MHU1 transports the taken substrate W to the feed unit SN1 of the first buffer unit BU1 (see FIG. 10). This enables the treatment layer A1 of the first treating block 3 to receive the substrates W.

When the substrate W is treated in the treatment layer A2, the substrate transport mechanism MHU1 transports the taken substrate W to the feed unit SN2 of the second buffer unit BU2. When the substrate W is treated in the treatment layer A3, the substrate transport mechanism MHU1 transports the taken substrate W to the feed unit SN3 of the third buffer unit BU3.

When all the substrates W are taken out from the carrier C, the shutter member of the opener 11 covers the opening 18 while moving to attach the lid to the carrier C. Thereafter, the carrier transport mechanism 61 transports the empty carrier C to either of the two openers 13, 14. Also, when the empty carrier C is transportable to neither of the two openers 13, 14, the carrier transport mechanism 61 transports the empty carrier C to an empty carrier shelf 74. Further, the carrier transport mechanism 61 transports the carrier C in which the untreated substrate W is accommodated, instead of the empty carrier C, from the input ports 71 or the untreated substrate carrier shelf 73 to the opener 11.

After taking all the substrates W from the carrier C of the opener 11, the substrate transport mechanism MHU1 takes the substrate W from the carrier C of the opener 12. The substrate transport mechanism MHU1 takes all the substrates W from the carrier C of the opener 12, and then takes the substrates W from the carrier C of the opener 11 again. That is, the substrate transport mechanism MHU1 takes substrates W from each of the carriers C of the two openers 11, 12 alternately in a carrier-by-carrier basis in principle.

The substrate transport mechanisms MHU1 is configured to distribute the substrates W on a carrier-by-carrier basis. For example, the substrates W taken from the first carrier C of the opener 11 are treated in the treatment layer A1. Next, the substrates W taken from the second carrier C of the opener 12 are treated in the treatment layer A2. Further next, the substrates W taken from the third carrier C of the opener 11 are treated in the treatment layer A3. That is, the substrates W are distributed on a carrier-by-carrier basis to the treatment layer A1, the treatment layer A2, and the treatment layer A3 repeatedly in this order.

[Step S02] Coating Treatment by First Treating Block 3

The treatment layer A1 of the first treating block 3 receives the substrate W from the ID block 2, and performs a coating treatment (first treatment) on the received substrate W. The treatment layer A1 transports the substrate W subjected to the coating treatment to the ID block 2.

Detailed description is as under. The third substrate transport mechanism MHU3 of the treatment layer A1 receives the substrate W transported to the feed unit SN1 of the buffer unit BU1. Thereafter, the substrate transport mechanism MHU3 transports the received substrates W to the adhesion enhancing treatment unit AHP, the cooling unit CP, and the coating unit PR in this order. The coating unit PR forms a photoresist film on the substrate W. Thereafter, the substrate transport mechanism MHU3 transports the substrate W on which the photoresist film is formed by the coating unit PR to the heat-treatment units PAB, the cooling unit CP, the edge exposing unit EEW, and the transfer unit PS1 (the buffer unit BU1) in this order. The substrate transport mechanism MHU3 transports the substrates W to a predetermined position (for example, the sixth substrate platform 31A from the bottom in FIG. 7) of the transfer unit PS1.

[Step S03] Substrate Transportation by Second Treating Block 5

The treatment layer B1 of the second treating block 5 receives the substrate W, transported to the ID block 2 by the treatment layer A1 of the first treating block 3, from the ID block 2, and transports the received substrate W to the IF block 6.

Detailed description is as under. In Step S02, the substrate transport mechanism MHU3 of the treatment layer A1 of the first treating block 3 transports the substrate W to a predetermined position (substrate platform 31A) of the transfer unit PS1 of the buffer unit BU1. The substrate transport mechanism MHU4 of the treatment layer B1 of the second treating block 5 receives the substrate W transported by the substrate transport mechanism MHU3 to a predetermined position (substrate platform 31A) of the transfer unit PS1. The substrate transportation from the treatment layer A1 to the treatment layer B1 is performed without using the two substrate transport mechanisms MHU1, MHU2 of the ID block 2. That is, the buffer unit BU1 (the substrate buffer BF) is disposed at a position where both the hands 21, 41 of the two substrate transport mechanisms MHU3, MHU4 can reach. In other words, the two substrate transport mechanisms MHU3, MHU4 are configured to be capable of taking the substrates W placed on the buffers BU1. Therefore, even when the substrates W are transported from the first treating block 3 to the second treating block 5 through the ID block 2, the two substrate transport mechanisms MHU1, MHU2 is preventative from being burdened.

The substrate transport mechanism MHU4 of the treatment layer B1 transports the substrates W, received from the transfer unit PS1, to the inspecting unit LSCM1 and the buffer unit PSBU4 in this order. The inspection unit LSCM1 inspects and measures the photoresist film (coating film) In Step S03, the treatment layer B1 does not perform the developing treatment (second treatment).

[Step S04] Substrate Transportation by IF Block 6

The IF block 6 unloads the substrate W transported by the treatment layer B1 of the second treating block 5 to the exposure device EXP. In addition, the IF block 6 loads the substrate W treated into the exposure device EXP.

Each of the two substrate transport mechanisms HU5, HU6 receives the substrate W from the buffer unit PSBU4. Each of the two substrate transport mechanisms HU5, HU6 transports the received substrates W to the pre-exposure cleaning unit 161 and the mounting-cum-cooling unit P-CP in this order. The substrate transport mechanism HU7 receives the substrate W from the mounting-cum-cooling unit P-CP, and unloads the received substrate W to the exposure device EXP. The exposure device EXP performs an exposure treatment on the unloaded substrate W. The substrate transport mechanism HU7 of the IF block 6 loads the substrate W treated in the exposure device EXP into the IF block 6, and transports the loaded substrate W to the substrate platform PS9. Thereafter, the two substrate transport mechanisms HU5, HU6 each receive the substrates W from the substrate platform PS9. Each of the two substrate transport mechanisms HU5, HU6 transports the received substrates W to the post-exposure cleaning unit SOAK, the post-exposure bake treatment unit PEB, and the buffer unit PSBU4 in this order.

[Step S05] Developing Treatment by Second Treating Block 5

The treatment layer B1 of the second treating block 5 receives the substrate W treated in the exposure device EXP from the IF block 6, performs the developing treatment (second treatment) on the received substrate W, and transports the substrate W subjected to the developing treatment to ID block 2.

Detailed description is as under. The substrate transport mechanism MHU4 of the treatment layer B1 receives the substrate W from the buffer unit PSBU4. The substrate transport mechanism MHU4 transports the received substrates W to the cooling unit CP, the developing unit DEV, the heat treatment unit POSTBake (denoted as "PB" in FIG. 11), the inspection unit LSCM2, and the return unit RT1 (the buffer unit BU1) in this order. The developing unit DEV performs the developing treatment on the substrate W exposed by the exposure device EXP. The inspection unit LSCM2 inspects the substrate W after the developing treatment.

[Step S06] Accommodating of Substrate W by ID Block 2

The ID block 2 returns the substrate W, subjected to the developing treatment, from the substrate buffer BF to the carrier C placed on the platform 16 of the opener 13, for example. The carrier C for returning the substrate W is a carrier C where the substrates W were accommodated before treatment (i.e., before taking out).

Detailed description is as under. The empty carrier C transported by the carrier transport mechanism 61 from the platform 16 of the two openers 11, 12 or the empty carrier shelf 74 is present in the opener 13 (or the opener 14). The transportation of the substrate W to the openers 13, 14 is performed by the second substrate transport mechanism MHU2.

The substrate transport mechanism MHU2 transports the substrate W, developed by the treatment layer B1 of the second treating block 5, from the return unit RT1 of the buffer unit BU1 to the carrier C placed on the platform 16 of the opener 13. When the substrate W is treated in the treatment layer B2, the substrate transport mechanism MHU2 transports the substrate W from the return unit RT2 of the buffer unit BU2 to the carrier C of either of the two openers 13, 14. When the substrate W is treated in the treatment layer B3, the substrate transport mechanism MHU2 transports the substrate W from the return unit RT3 of the buffer unit BU3 to the carrier C of either of the two openers 13, 14.

The substrate transport mechanism MHU2 accommodates all the substrates W in the carrier C of the opener 13, and then accommodates the substrates W in the carrier C of the opener 14. Thereafter, the substrate transport mechanism MHU2 accommodates all the substrates W in the carrier C of the opener 14, and then accommodates the substrates W in the carrier C of the opener 13. That is, the substrate transport mechanism MHU2 accommodates the substrates W in each of the carriers C of the openers 13, 14 alternately in a carrier-by-carrier basis in principle.

The carrier transport mechanism 61 transports the carrier C accommodating the treated substrate W to the output ports 72 or the treated substrate carrier shelves 75. The carrier transport mechanism 61 also transports the empty carrier C, instead of the transported carrier C, from the platform 16 of the two openers 11, 12 or the empty carrier shelves 74 to the platform 16 of either of the two openers 13, 14. The external transport mechanism OHT transports the carrier C accommodating the treated substrate W from either of the two output ports 72 to another device, for example.

With the embodiment of the present embodiment, reduction in throughput is suppressible. For instance, it is assumed that the ID block, the first treating block, and the second treating block are arranged in this order. In this case, in order to transport the substrate W treated in the second treating block to the ID block, the substrate W is necessarily sent through the first treating block without any treatment in the first treating block. However, according to this embodiment, the first treating block 3 and the second treating block 5 are both connected to the ID block 2. Therefore, transportation of the substrate W is performable directly from the second treating block 5 to the ID block 2 without through the first treating block 3. Therefore, reduction in throughput is suppressible.

Further, the substrate buffer BF is disposed in the middle of the two treating blocks 3, 5. Therefore, transportation of the substrate W is performable from the first treating block 3 to the second treating block 5 through the substrate buffer BF. Since such transportation is performed without using the substrate transportation by ID block 2, reduction in burden of the substrate transportation by the ID block 2 is obtainable. Therefore, enhanced throughput is obtainable.

Figure 14:
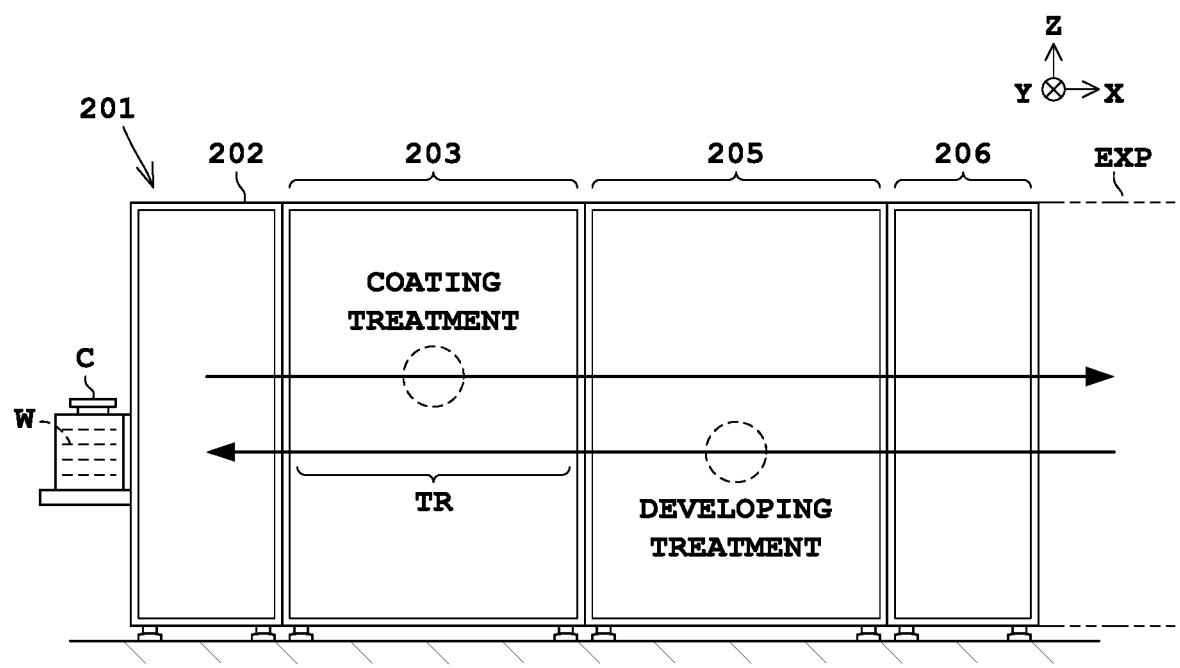
FIG. 14 illustrates an effect of the first embodiment.

Thus, such a configuration where the IF block 6 is connected to the second treating block 5 achieves suppressed reduction in throughput. Detailed description is as under. In FIG. 14, a currently-used substrate treating apparatus transports a substrate between the ID block 202 and an IF block 206. When the substrate is transported from the ID block 202 to the IF block 206, a coating block 203 performs a coating treatment on the substrate, but a developing block 205 does not perform a developing treatment on the substrate. In addition, when the substrate is transported from the IF block 206 to the ID block 202, the developing block 205 performs a developing treatment on the substrate, but the coating block 203 does not perform a coating treatment on the substrate. Thus, the substrate is transported in the treating block without the coating treatment or the developing treatment. Such transportation may also cause reduction in throughput of the substrate treating apparatus. Specifically, the invention of this embodiment can omit the transportation of the substrates (denoted by reference numeral TR in FIG. 14) in the coating block 203 in the return path.

Further, the substrate treating apparatus 1 includes the carrier storage shelves 63 and the carrier transport mechanism 61. The carrier storage shelves 63 are mounted on at least one of the ID block 2, the first treating block 3 and the second treating block 5, and accommodates the carrier C. The carrier transport mechanism 61 is mounted on at least one of ID block 2, the first treating block 3 and the second treating block 5. The carrier transport mechanism 61 transports the carrier C between the platform 16 and the carrier storage shelves 63.

If the carrier storage shelf 63 and the carrier transport mechanism 61 are provided horizontally with respect to the ID block 2 and the two treating blocks 3, 5, then the footprint of the substrate treating apparatus 1 is increased accordingly. In this regard, the carrier storage shelf 63 and the carrier transport mechanism 61 are arranged to overlap in plan view with at least one of the ID block 2 and the two treating block 3,5. As a result, suppressed increase in footprint of the substrate treating apparatus 1 is obtainable.

In the present exemplary embodiment, the substrate transport mechanism MHU1 distributes the substrates W to the treatment layers A1 to A3 in carrier-by-carrier basis. However, the distribution method of the substrates W is not limited to the above-described method. For example, the substrate W taken from the first carrier C may be treated in either of the two treatment layers A1, A2 and the substrate W taken from the second carrier C may be treated in the treatment layer A3. The substrates W taken from the first carrier C may be treated in the three treatment layers A1 to A3. In this case, the ID block 2 will allow the three treatment layers A1 to A3 to receive the substrate W.

In this embodiment, the substrate transport mechanism MHU1 transports the substrates W one by one. In this regard, a plurality (e.g., three) of substrates W may be transported at the same time. For example, it is assumed that first to third substrates W from the bottom of the carrier C are taken at the same time. When the treatment layers A1 to A3 perform a substrate treatment on a carrier-by-carrier basis, the three taken substrates W may be placed at the same time to the feed unit SN1 of the buffer unit BU1 (see FIG. 10) in order to treat the first to third substrates W in the treatment layer A1, for example. This reduces the burden of the first substrate transport mechanism MHU1. Further, when the treatment layers A1 to A3 share to treat the substrates in one carrier C, the three substrates W may be placed one by one on the feed units SN1 to SN3 of the buffer units BU1 to BU3, respectively, so as to treat the first substrates W in the treatment layer A1, the second substrates W in the treatment layer A2, and the third substrates W in the treatment layer A3, for example. This reduces the burden of the first substrate transport mechanism MHU1 as well as of the burden of the third substrate transport mechanisms MHU3 of the treatment layers A1 to A3.

Further, the substrate transportation by the substrate transport mechanism MHU1 may be performed as follows. In the first substrate transportation, the substrate transport mechanism MHU1 takes the first, fourth, and seventh substrates W from the bottom of the carrier C at the same time. Thereafter, the substrate transport mechanism MHU1 puts the three taken substrates W into a state in which the treatment layer A1 enables reception of them. In the second substrate transportation, the substrate transport mechanism MHU1 takes the second, fifth, and eighth substrates W from the bottom of the carrier C at the same time. Thereafter, the substrate transport mechanism MHU1 puts the three taken substrates W into a state in which the treatment layer A2 enables reception of them. Then, in the third substrate transportation, the substrate transport mechanism MHU1 takes the third, sixth, and ninth substrates W from the bottom of the carrier C at the same time. Thereafter, the substrate transport mechanism MHU1 puts the three taken substrates W into a state in which the treatment layer A3 enables reception of them. This reduces the burden of the first substrate transport mechanism MHU1 as well as of the burden of the third substrate transport mechanisms MHU3 of the treatment layers A1 to A3. Further, enhanced efficiency in transporting the treated substrates W to the exposure device EXP is obtainable. The following describes the reason for the above. In the exposure device EXP, the exposing order is programmed according to the accommodation position of the substrate W in the carrier C. Therefore, the substrate treating apparatus 1 needs to transport the substrate W to the exposure device EXP in the order of accommodation positions of the substrates W. The substrate treating apparatus 1 efficiently treats and transports the substrates W in the order of its accommodation positions. Thus, since the substrates W is efficiently transportable to the exposure device EXP in the order of the accommodation positions of the substrates W, enhanced throughput is obtainable.

SECOND EMBODIMENT

The following describes a second embodiment of the present invention with reference to the drawings. Here, the description common to that of the first embodiment is to be omitted.

Figure 15:
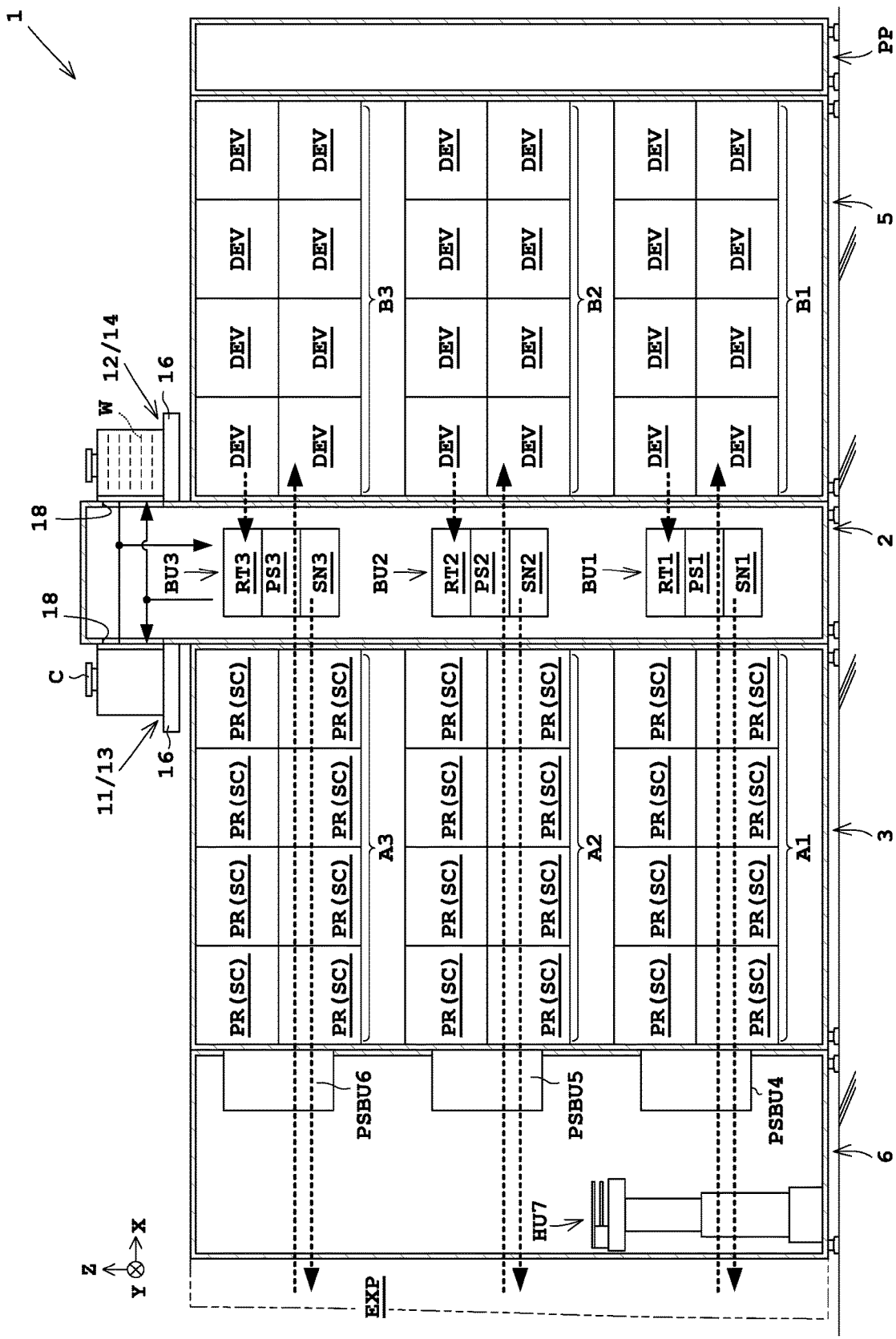
FIG. 15 is a right side view of a substrate treating apparatus according to a second embodiment.

In the first embodiment, the IF block 6 is connected to the second treating block 5 which performs the developing treatment. In this regard, in this embodiment, the IF block 6 is connected to the first treating block 3 which performs the coating treatment as shown in FIG. 15. The IF block 6, the first treating block 3, the ID block 2, and the second treating block 5 are linearly connected in the horizontal direction in this order. In this embodiment, the IF block 6 and the first treating block 3 correspond to the first treating device. The second treating block 5 corresponds to the second treating device.

<Operation of Substrate Treating Apparatus 1>

Figure 16:
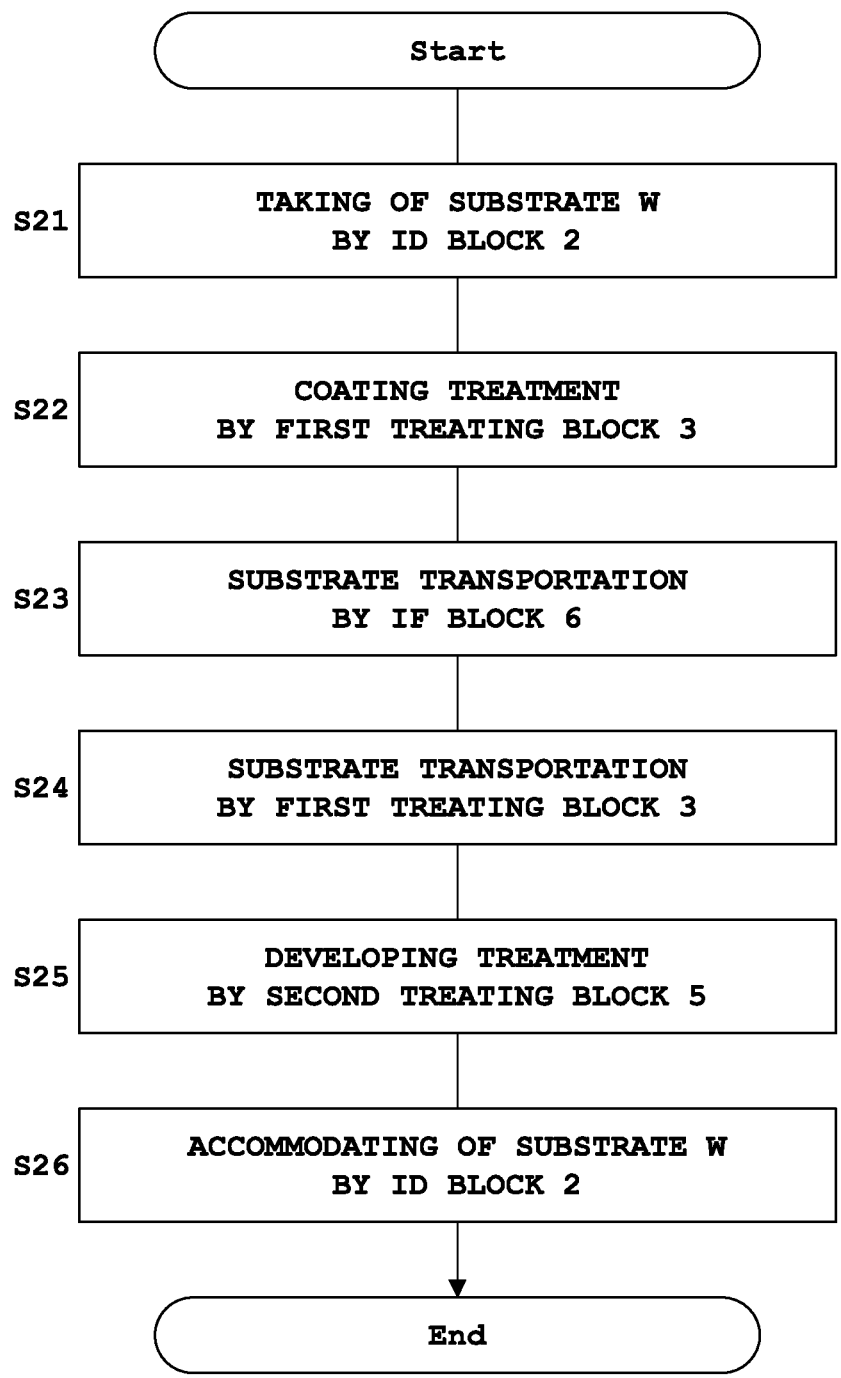
FIG. 16 is a flowchart illustrating operation of the substrate treating apparatus according to the second embodiment.

The following describes operation of the substrate treating apparatus 1 of this embodiment with reference to FIG. 15. FIG. 16 is a flowchart illustrating the operation of the substrate treating apparatus 1 according to the second embodiment.

[Step S21] Taking of Substrate W by ID Block 2

The ID block 2 takes a substrate W from the carrier C placed on the platform 16 of the opener 11. The taken substrate W is transported by the substrate transport mechanism MHU1, for example, to the feed unit SN1 of the buffer unit BU1.

[Step S22] Coating Treatment by First Treating Block 3

The treatment layer A1 of the first treating block 3 receives the substrate W from the ID block 2, and performs a coating treatment (first treatment) on the received substrate W. In other words, the substrate transport mechanism MHU3 of the treatment layer A1 receives the substrate W from the feed unit SN1 and transports the received substrate W to, for example, the coating unit PR and the predetermined heat-treatment unit 37 (including the cooling unit CP). Thereafter, the substrate transport mechanism MHU3 of the treatment layer A1 transports the substrate W, subjected to the coating treatment, to the buffer unit PSBU4 of the IF block 6.

[Step S23] Substrate Transportation by IF Block 6

The IF block 6 unloads the substrate W transported by the treatment layer A1 to the exposure device EXP. In addition, the IF block 6 loads the substrate W, subjected to the exposure treatment by the exposure device EXP, into the IF block 6. The substrate W subjected to the exposure treatment is transported to the buffer unit PSBU4 for transporting to the first treating block 3.

[Step S24] Substrate Transportation by First Treating Block 3

The treatment layer A1 of the first treating block 3 receives the substrate W treated in the exposure device EXP from the IF block 6, and transports the received substrate W to the ID block 2. Detailed description is as under. The substrate transport mechanism MHU3 of the treatment layer A1 receives the substrate W, subjected to the exposure treatment, from the buffer unit PSBU4. Thereafter, the substrate transport mechanism MHU3 transports the received substrate W to a predetermined position (e.g., substrate platform 31A) of the transfer unit PS1 of the buffer unit BU1 in the ID block 2 without performing the coating treatment on the received substrate W.

[Step S25] Developing Treatment by Second Treating Block 5

The treatment layer B1 of the second treating block 5 receives the substrate W, transported to the ID block 2 by the treatment layer A1 of the first treating block 3, from the ID block 2, and performs the developing treatment (second treatment) on the received substrate W. That is, the substrate transport mechanism MHU4 of the treatment layer B1 receives the substrate W, transported without using the two substrate transport mechanisms MHU1, MHU2 of the ID block 2, from the predetermined position (e.g., the substrate platform 31A) of the transfer unit PS1 in the buffer unit BU1. Thereafter, the substrate transport mechanism MHU4 transports the received substrate W to the developing unit DEV and the predetermined heat-treatment unit 37. Thereafter, the substrate transport mechanism MHU4 transports the substrate W, subjected to the developing treatment by the developing unit DEV or the like, to the return unit RT1 of the buffer unit BU1 in the ID block 2.

[Step S26] Accommodating of Substrate W by ID Block 2

The ID block 2 returns the substrate W, subjected to the developing treatment, from the substrate buffer BF to the carrier C placed on the platform 16 of the opener 13, for example. That is, the substrate transport mechanism MHU2 receives the substrate W from the return unit RT1 of the buffer unit BU1, and transports the received substrate W to the carrier C placed on the platform 16 of the opener 13, for example.

With the present embodiment, such a configuration where the IF block 6 is connected to the first treating block 3 achieves suppressed reduction in throughput.

THIRD EMBODIMENT

The following describes a third embodiment of the present invention with reference to the drawings. Here, the description common to that of the first and second embodiments is to be omitted.

Figure 17:
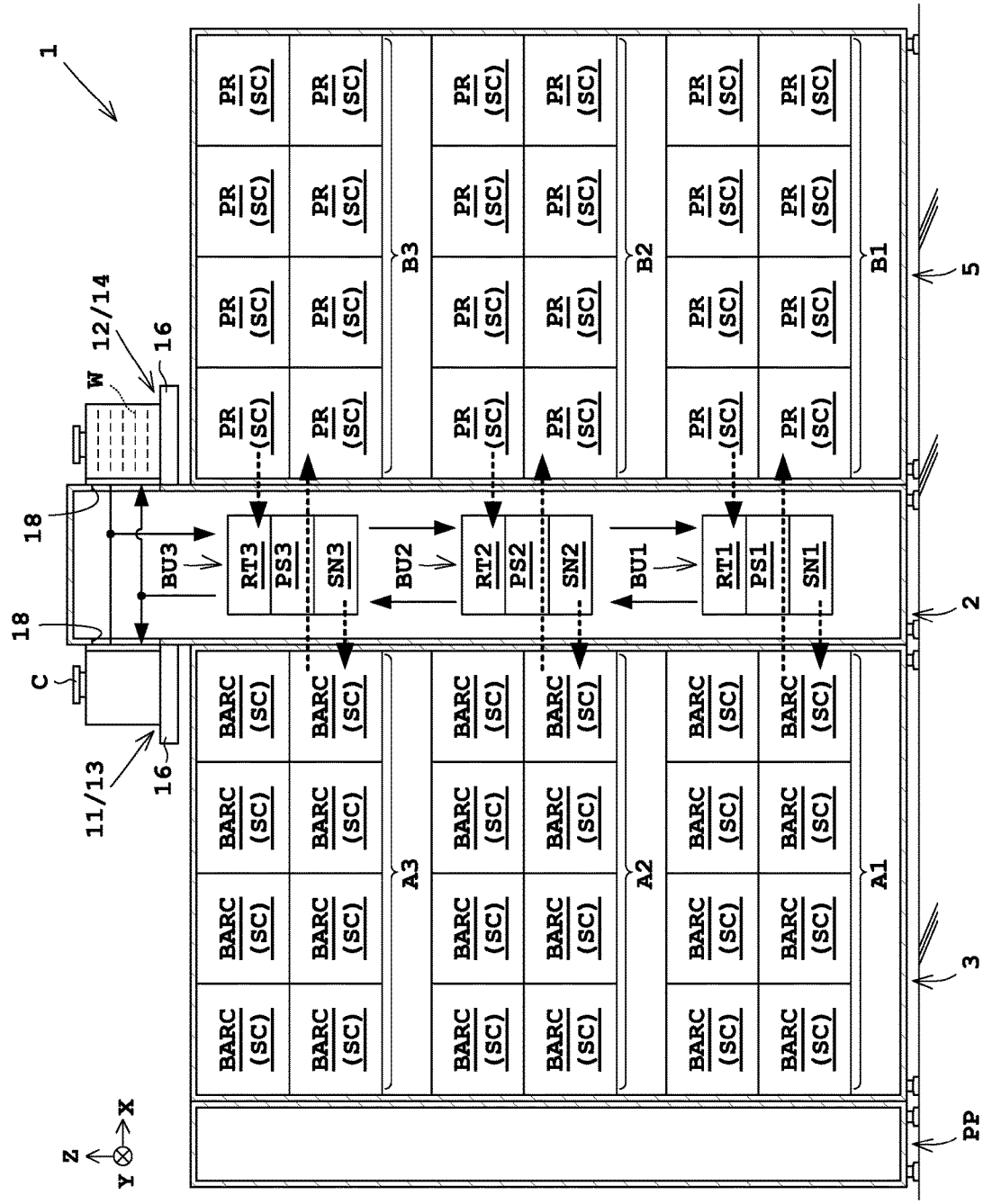
FIG. 17 is a right side view of a substrate treating apparatus according to a third embodiment.

In the first embodiment, the substrate treating apparatus 1 includes the IF block 6. In this regard, in the third embodiment, the substrate treating apparatus 1 does not include the IF block 6 (does not perform the exposure treatment) as shown in FIG. 17. Here in this embodiment, the first treating block 3 corresponds to the first treating device of the present invention. The second treating block 5 corresponds to the second treating device of the present invention.

<Operation of Substrate Treating Apparatus 1>

Figure 18:
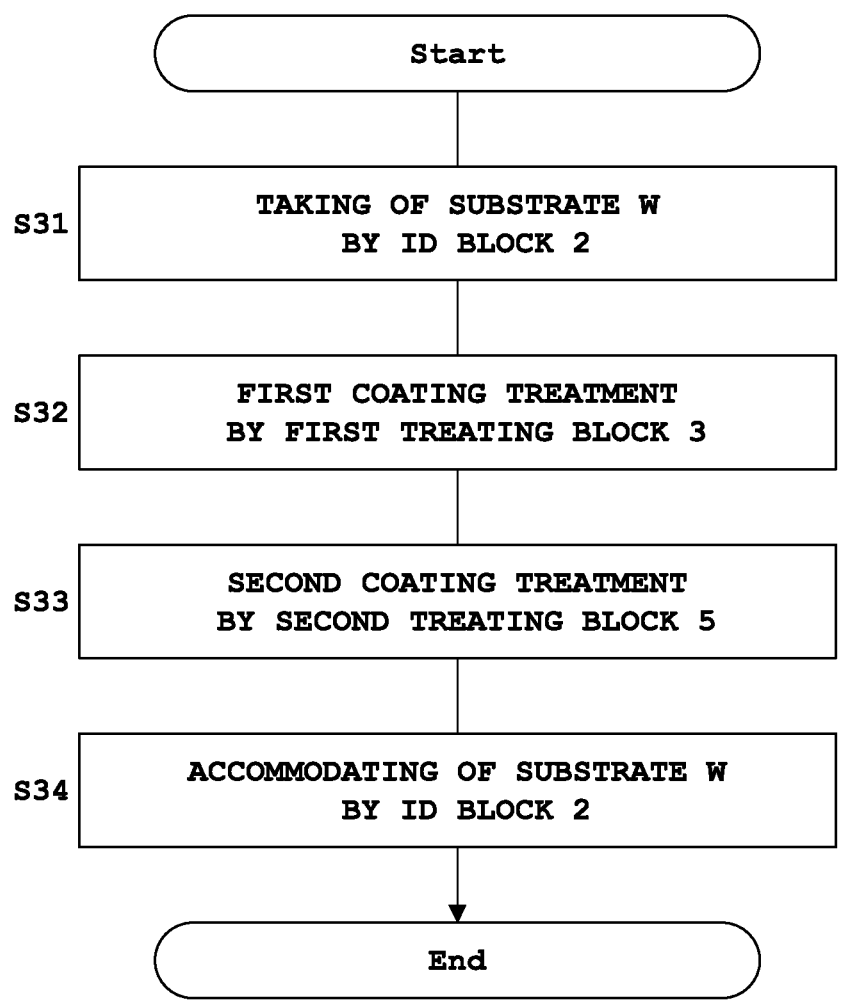
FIG. 18 is a flowchart illustrating operation of the substrate treating apparatus according to the third embodiment.

The following describes operation of the substrate treating apparatus 1 of this embodiment with reference to FIG. 17. The three treatment layers A1 to A3 of the first treating block 3 include the coating units BARC, for example, instead of the coating units PR shown in FIG. 10. The coating units BARC form an antireflection film on the substrate W. In other words, each of the treatment layers A1 to A3 forms an antireflection film on the substrate W. In addition, each of the treatment layers B1 to B3 forms a photoresist film on the antireflection film of the substrate W. FIG. 18 is a flowchart illustrating the operation of the substrate treating apparatus 1 according to the third embodiment.

[Step S31] Taking of Substrate W by ID Block 2

The substrate transport mechanism MHU1 of the ID block 2 takes a substrate W from the carrier C placed on the platform 16 of the opener 11, for example. The taken substrate W is transported by the substrate transport mechanism MHU1, for example, to the feed unit SN1 of the buffer unit BU1. This enables the treatment layer A1 to receive the substrates W.

[Step S32] First Coating Treatment by First Treating Block 3

The treatment layer A1 of the first treating block 3 receives the substrate W taken by the ID block 2 from the carrier C. That is, the substrate transport mechanism MHU3 of the treatment layer A1 receives the substrate W from the feed unit SN1 in the buffer unit BU1. The substrate transport mechanism MHU3 transports the received substrate W to the coating unit BARC and the predetermined heat-treatment unit 37 in this order. Thereafter, the substrate transport mechanism MHU3 transports the substrate W on which an antireflective film is formed by the coating unit BARC to a predetermined position (e.g., substrate platform 31A) of the transfer unit PS1 of the buffer unit BU1 in the ID block 2.

[Step S33] Second Coating Treatment by Second Treating Block 5

The treatment layer B1 of the second treating block 5 receives the substrate W, transported to the ID block 2 by the treatment layer A1 of the first treating block 3, from the ID block 2. That is, the substrate transport mechanism MHU4 of the treatment layer B1 receives the substrate W, transported without using the two substrate transport mechanisms MHU1, MHU2 of the ID block 2, from the predetermined position (e.g., the substrate platform 31A) of the transfer unit PS1 in the buffer unit BU1. The substrate transport mechanism MHU4 transports the received substrate W to the coating unit PR and the predetermined heat-treatment unit 37 in this order. Thereafter, the substrate transport mechanism MHU4 transports the substrate W on which a photoresist film is formed by the coating unit PR to the return unit RT1 of the buffer portion BU1 in the ID block 2.

[Step S34] Accommodating of Substrate W by ID Block 2

The ID block 2 returns the substrate W, subjected to a resist coating treatment in the second treating block 5 (second treatment), from the substrate buffer BF to the carrier C placed on the platform 16 of the opener 13, for example. That is, the substrate transport mechanism MHU2 of the ID block 2 transports the substrate W from the return unit RT1 of the buffer unit BU1 to the carrier C of either of the opener 13.

With the embodiment of the present embodiment, reduction in throughput is suppressible. For instance, it is assumed that the ID block, the first treating block, and the second treating block are arranged in this order. In this case, in order to transport the substrate W treated in the second treating block to the ID block, the substrate W is necessarily sent through the first treating block without any treatment in the first treating block. However, according to this embodiment, the first treating block 3 and the second treating block 5 are both connected to the ID block 2. Therefore, direct transportation of the substrate W is performable from the second treating block 5 to the ID block 2 without through the first treating block 3. Accordingly, reduction in throughput is suppressible.

Further, the substrate buffer BF is disposed in the middle of the two treating blocks 3, 5. Therefore, transportation of the substrate W is performable from the first treating block 3 to the second treating block 5 through the substrate buffer BF. Since such transportation is performed without using the substrate transportation by ID block 2, reduction in burden of the substrate transportation by the ID block 2 is obtainable. Therefore, enhanced throughput is obtainable.

FOURTH EMBODIMENT

A fourth embodiment of the present invention will now be described with reference to the drawings. Here, the description common to that of the first to third embodiments is to be omitted.

In the first embodiment, the three treatment layers A1 to A3 of the first treating block 3 perform the coating treatment, and the three treatment layers B1 to B3 of the second treating block 5 performs the developing treatment. That is, the two types of treatments (the first and second treatments) are performed by the two treating block 3, 5. In this regard, in the fourth embodiment, the three types of treatments (the first to third treatments) are performed by the two treating block 3, 5.

Figure 19:
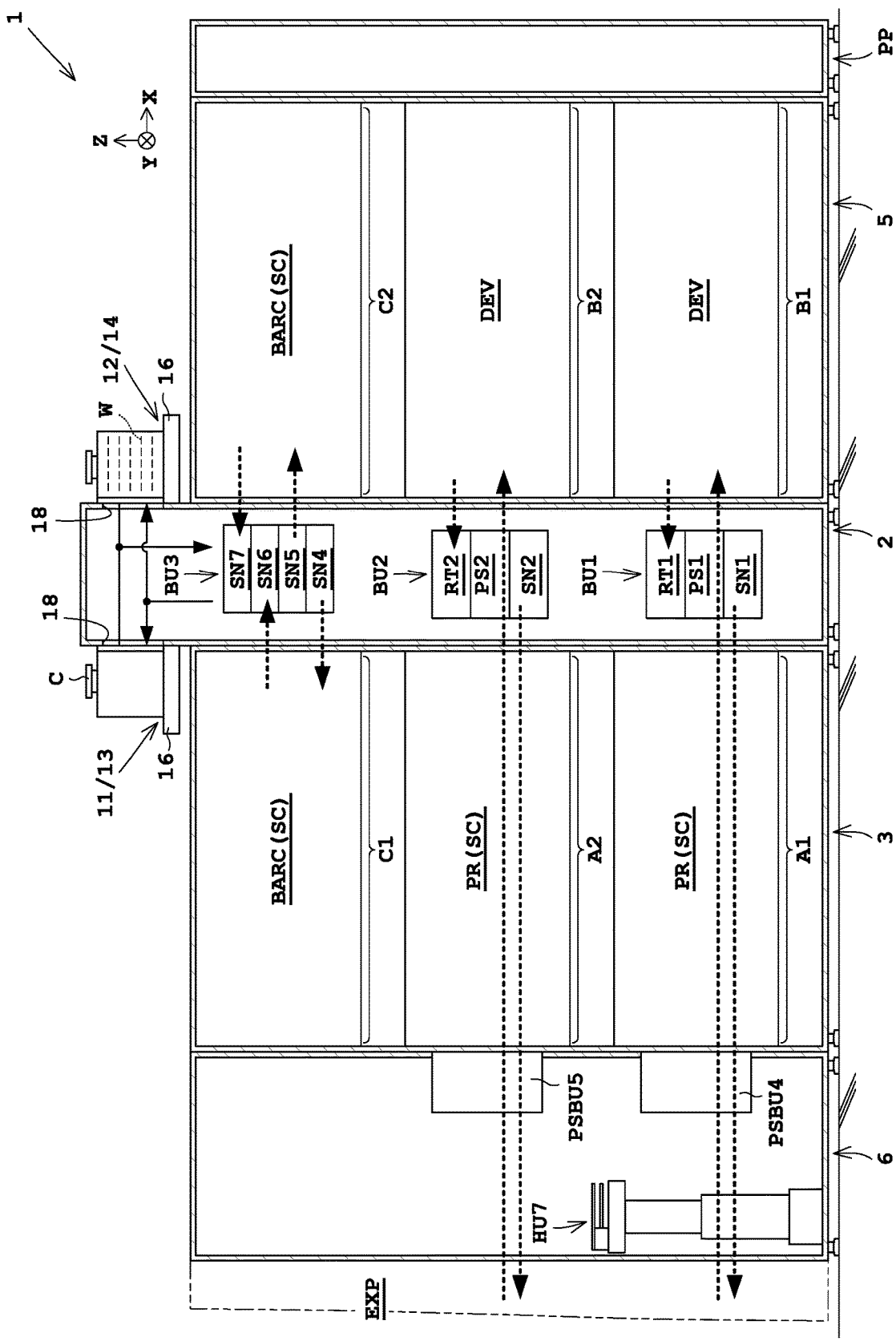
FIG. 19 is a right side view of a substrate treating apparatus according to a fourth embodiment.

Reference is made to FIG. 19. The first treating block 3 includes three treatment layers A1, A2, and C1 arranged to be stacked vertically. The second treating block 5 includes three treatment layers B1, B2, and C2 arranged to be stacked vertically. The treatment layer A1 is arranged in the same level as the treatment layer B1 and the buffer unit BU1. The treatment layer A2 is arranged in the same level as the treatment layer B2 and the buffer unit BU2. The treatment layer C1 is arranged in the same level as the treatment layer C2 and the buffer unit BU3. In this embodiment, the buffer unit BU3 includes four feed units SN4 to SN7. Each of the feed units SN4 to SN7 is capable of placing a plurality of substrates W.

The two treatment layers C1, C2 each form an antireflection film on the substrate W, for example. The two treatment layers A1, A2 each form a photoresist film on the anti-reflection film of the substrate W, for example. Then, the two treatment layers B1, B2 each performs a developing treatment on the substrate W, for example. In FIG. 19, the first treating block 3 includes the treatment layer A1 and the treatment layer C1. The treatment layer A1 forms the photoresist film on the substrate W. The treatment layer C1 forms an anti-reflection film on the substrate W in a level (third floor) different from the treatment layer A1 (first floor). The IF block 6, the first treating block 3, the ID block 2, and the second treating block 5 are linearly connected in the horizontal direction in this order. In this embodiment, the IF block 6 and the first treating block 3 correspond to the first treating device. The second treating block 5 corresponds to the second treating device.

<Operation of Substrate Treating Apparatus 1>

Figure 20:
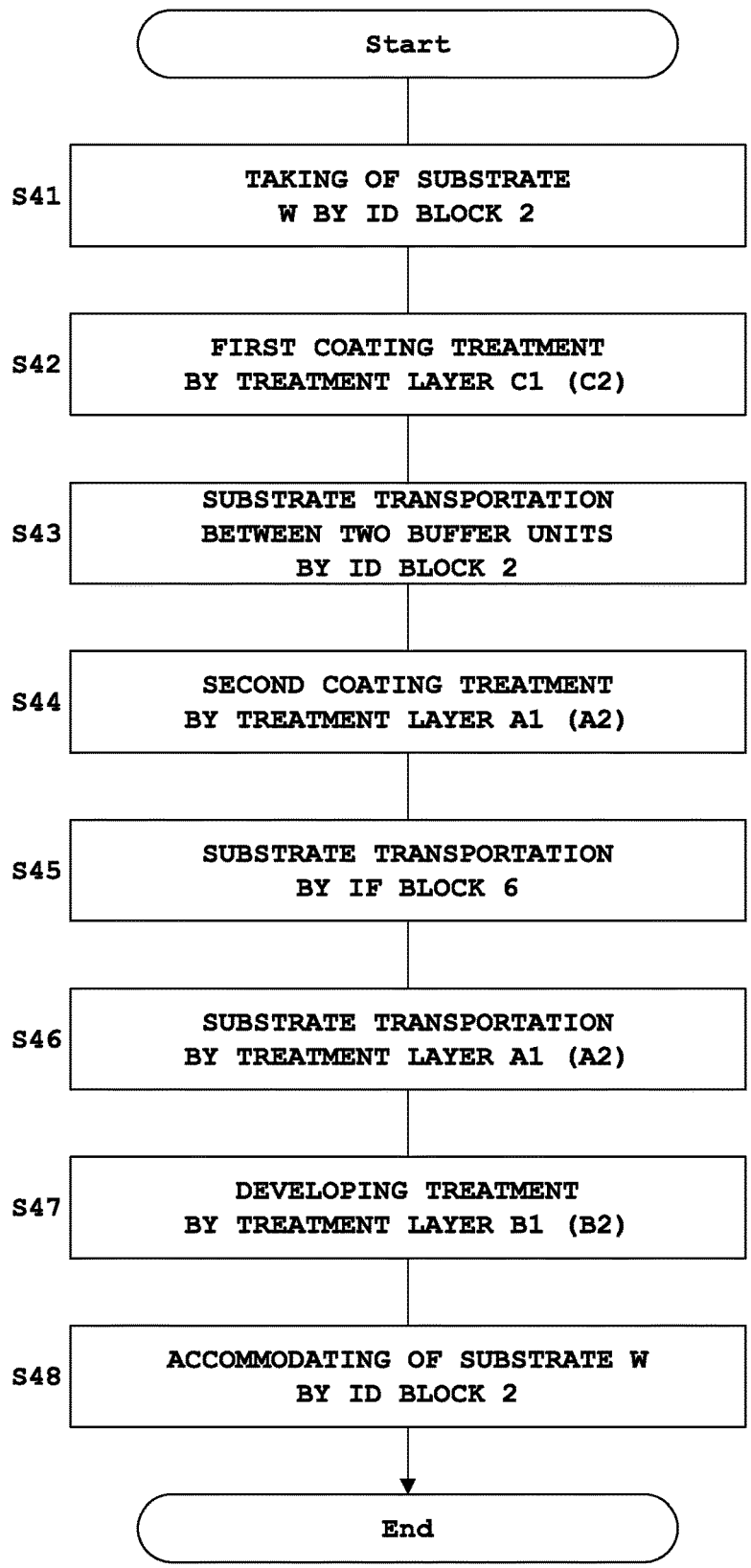
FIG. 20 is a flowchart illustrating operation of the substrate treating apparatus according to the fourth embodiment.

The following describes operation of the substrate treating apparatus 1 of this embodiment with reference to FIG. 19. FIG. 20 is a flowchart illustrating the operation of the substrate treating apparatus 1 according to the fourth embodiment.

[Step S41] Taking of Substrate W by ID Block 2

The substrate transport mechanism MHU1 of the ID block 2 takes a substrate W from the carrier C placed on the platform 16 of the opener 11, for example. The taken substrate W is transported by the substrate transport mechanism MHU1, for example, to the feed unit SN4 of the buffer unit BU3. This enables the treatment layer C1 to receive the substrates W. The substrate transport mechanism MHU1 transports the substrate W to the feed unit SN5 of the buffer unit BU3. This enables the treatment layer C2 to receive the substrate W.

[Step S42] First Coating Treatment by Treatment Layer C1 (C2)

The treatment layer C1 receives the substrate W from the ID block 2, and performs the treatment (the third treatment) of forming an anti-reflection film on the received substrate W. That is, the third substrate transport mechanism MHU3 of the treatment layer C1 receives the substrate W from the feed unit SN4 of the buffer unit BU3. The substrate transport mechanism MHU3 transports the received substrate W to the coating unit BARC and the predetermined heat-treatment unit 37 in this order. Thereafter, the substrate transport mechanism MHU3 transports the substrate W on which an antireflective film is formed by the coating unit BARC to the feed unit SN6 of the buffer unit BU3 of the ID block 2. The feed unit SN6 is used for a substrate transportation between two levels. Here, the treatment layer C2 receives the substrate W from the feed unit SN5 of the buffer unit BU3. The treatment layer C2 transports the received substrate W to the coating unit BARC and the predetermined heat-treatment unit 37 in this order. Thereafter, the treatment layer C2 transports the substrate W on which an antireflective film is formed to the feed unit SN7 of the buffer unit BU3 of the ID block 2.

[Step S43] Substrate Transportation Between Two Buffers by ID Block 2

The ID block 2 moves the substrate W on which the anti-reflection coating is formed to a level of the treatment layer A1 (the first floor). That is, one of the substrate transport mechanisms MHU1, MHU2 of the ID block 2 transports the substrate W from the feed unit SN6 of the buffer unit BU3 to the feed unit SN1 of the buffer unit BU1. This enables the treatment layer A1 to receive the substrates W. When the substrate W is treated in the treatment layer C2, the substrate W is transported from the feed unit SN7 of the buffer unit BU3 to the feed unit SN2 of the buffer unit BU2. This enables the treatment layer A2 to receive the substrate W.

[Step S44] Second Coating Treatment by Treatment Layer A1 (A2).

The treatment layer A1 receives the substrate W on which the anti-reflection coating is formed from the ID block 2. That is, the substrate transport mechanism MHU3 of the treatment layer A1 receives the substrate W from the feed unit SN1 in the buffer unit BU1. The substrate transport mechanism MHU3 transports the received substrate W to the coating unit PR and the predetermined heat-treatment unit 37 in this order. Thereafter, the substrate transport mechanism MHU3 transports the substrate W on which the photoresist film is formed by the coating unit PR to the buffer unit PSBU4 of the IF block 6. The treatment layer A2 receives the substrate W from the feed unit SN2 of the buffer unit BU2. The treatment layer A2 transports the received substrate W to the coating unit PR and the predetermined heat-treatment unit 37 in this order. Thereafter, the treatment layer A2 transports the substrate W on which the photoresist film is formed to the buffer portion PSBU5 of the IF block 6.

[Step S45] Substrate Transportation by IF Block 6

The IF block 6 unloads the substrate W transported by the treatment layer A1 (A2) to the exposure device EXP. In addition, the IF block 6 loads the substrate W, subjected to the exposure treatment by the exposure device EXP, into the IF block 6. The substrate W subjected to the exposure treatment is transported to the buffer unit PSBU4 in order to be transported to the treatment layer A1. Moreover, the substrate W subjected to the exposure treatment is transported to the buffer unit PSBU5 in order to be transported to the treatment layer A2. The substrate W transported from the treatment layer A1 is returned to the treatment layer A1. The substrate W transported from the treatment layer A2 is returned to the treatment layer A2.

[Step S46] Substrate Transportation by Treatment Layer A1 (A2)

The treatment layer A1 receives the substrate W treated in the exposure device EXP from the IF block 6, and transports the received substrate W to the ID block 2. That is, the substrate transport mechanism MHU3 of the treatment layer A1 receives the substrate W, subjected to the exposure treatment, from the buffer unit PSBU4. Thereafter, the substrate transport mechanism MHU3 transports the received substrate W to a predetermined position (e.g., substrate platform 31A) of the transfer unit PS1 of the buffer unit BU1 finally without performing the coating treatment on the received substrate W. The treatment layer A2 receives the substrate W subjected to the exposure treatment from the buffer unit PSBU5, and finally transports the received substrate W to the predetermined position in the transfer unit PS2 of the buffer unit BU2.

[Step S47] Developing Treatment by Treatment Layer B1 (B2)

The treatment layer B1 receives the substrate W, transported to the ID block 2 by the treatment layer A1, from the ID block 2. That is, the substrate transport mechanism MHU4 of the treatment layer B1 receives the substrate W from a predetermined position (e.g., substrate platform 31A) in the transfer unit PS1 of the buffer unit BU1. The substrate transportation from the treatment layer A1 to the treatment layer B1 is performed without using the two substrate transport mechanisms MHU1, MHU2 of the ID block 2. Thereafter, the substrate transport mechanism MHU4 transports the received substrate W to the developing unit DEV and the predetermined heat-treatment unit 37 in this order. Thereafter, the substrate transport mechanism MHU4 transports the substrate W, subjected to the developing treatment by the developing unit DEV, to the return unit RT1 of the buffer unit BU1 in the ID block 2. The treatment layer B2 receives the substrate W from the predetermined position in the transfer unit PS2 of the buffer unit BU2. The treatment layer B2 transports the received substrate W to the developing unit DEV and the predetermined heat-treatment unit 37 in this order. Thereafter, the treatment layer B2 transports the substrate W subjected to the developing treatment to the return unit RT2 of the buffer unit BU2 of the ID block 2.

[Step S48] Accommodating of Substrate W by ID Block 2

The ID block 2 returns the substrate W, subjected to the developing treatment, from the substrate buffer BF to the carrier C placed on the platform 16 of the opener 13, for example. That is, the substrate transport mechanism MHU2 receives the substrate W from the return unit RT1 (RT2) of the buffer unit BU1 (BU2), and transports the received substrate W to the carrier C placed on the platform 16 of the opener 13.

In this operational explanation, when the substrate W is transported to the treatment layer C1, the treatments are performed in the treatment layer C1, the treatment layer A1, and the treatment layer B1 in this order. Moreover, when the substrate W is transported to the treatment layer C2, the treatments are performed in the treatment layer C2, the treatment layer A2, and the treatment layer B2 in this order. The treatments may be performed in the treatment layer C1, the treatment layer A2, and the treatment layer B2 in this order. Moreover, the treatments may be performed in the treatment layer C2, the treatment layer A1, and the treatment layer B1 in this order.

According to the present embodiment, since both the first treating block 3 (treatment layer A1 and treatment layer C1) and the second treating block 5 (treatment layer B1) are connected to the ID block 2, reduction in throughput is suppressible. The substrate buffer BF is disposed in the middle of the treatment layer A1 and the treatment layer B1, for example. Therefore, transportation of the substrate W is performable from the treatment layer A1 to the treatment layer B1 through the substrate buffer BF. Since such transportation is performed without using the substrate transportation by ID block 2, reduction in burden of the substrate transportation by the ID block 2 is obtainable. Accordingly, enhanced throughput is obtainable.

FIFTH EMBODIMENT

A fifth embodiment of the present invention will now be described with reference to the drawings. Here, the description common to that of the first to fourth embodiments is to be omitted.

In the fourth embodiment, the substrate treating apparatus 1 includes the IF block 6. In this regard, in the fifth embodiment, the substrate treating apparatus 1 does not include the IF block 6 as shown in FIG. 21.

<Operation of Substrate Treating Apparatus 1>

Figure 21:
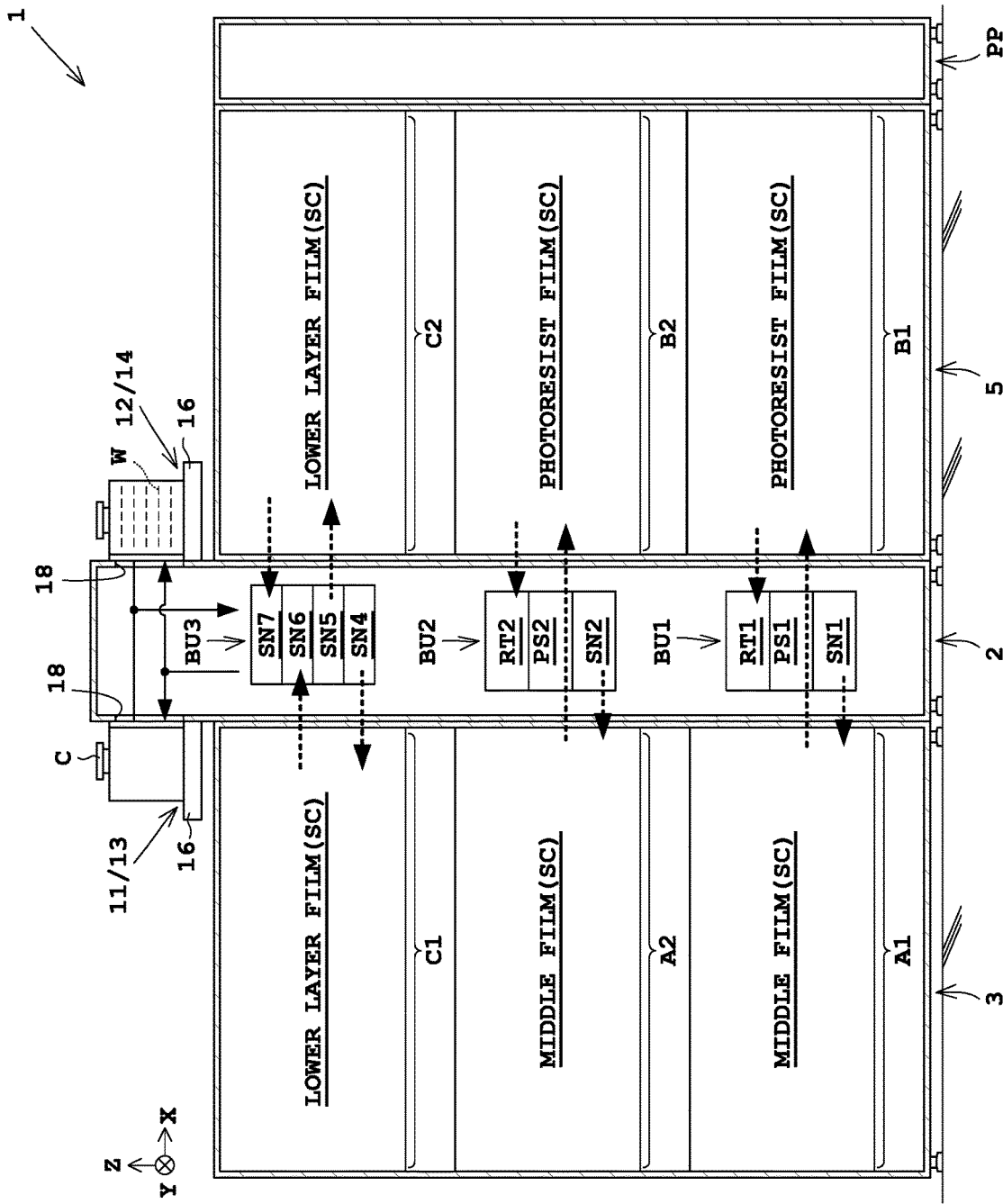
FIG. 21 is a right side view of a substrate treating apparatus according to a fifth embodiment.
Figure 22:
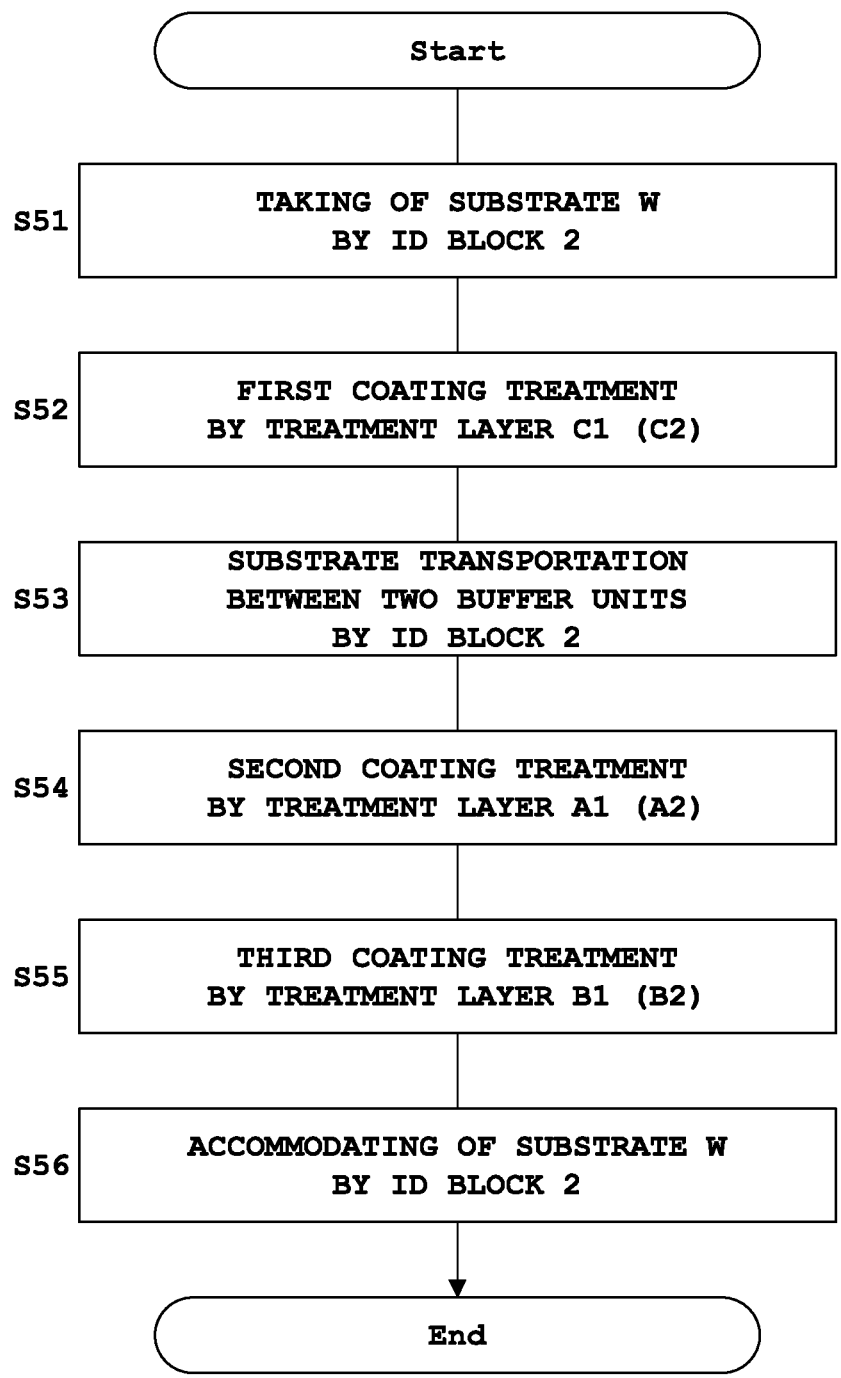
FIG. 22 is a flowchart illustrating operation of the substrate treating apparatus according to the fifth embodiment.

The following describes operation of the substrate treating apparatus 1 of this embodiment with reference to FIG. 21. The substrate treating apparatus 1 of this embodiment forms a three-layered film, for example. The two treatment layers C1, C2 each form a lower layer film (e.g., an SOC (spin-on carbon) film) The two treatment layers A1, A2 each form a middle film (e.g., an SOG (spin-on glass) film) Then, the two treatment layers B1, B2 each form a photoresist film FIG. 22 is a flowchart illustrating the operation of the substrate treating apparatus 1 according to the fifth embodiment.

[Step S51] Taking of Substrate W by ID Block 2

A step 51 is operated in the same manner as in the step S41. This step is briefly described. The substrate transport mechanism MHU1 takes a substrate W from the carrier C of the opener 11, for example. Thereafter, the substrate transport mechanism MHU1 transports the taken substrate W to the feed unit SN4 of the buffer unit BU3, for example.

[Step S52] First Coating Treatment by Treatment Layer C1 (C2)

The treatment layer C1 receives the substrate W from the ID block 3, and performs the treatment (the third treatment) of forming the lower layer on the received substrate W. That is, the third substrate transport mechanism MHU3 of the treatment layer C1 receives the substrate W from the feed unit SN4 of the buffer unit BU3. The substrate transport mechanism MHU3 transports the received substrate W to the coating unit SC and the predetermined heat-treatment unit 37 in this order. Thereafter, the substrate transport mechanism MHU3 transports the substrate W on which the lower layer is formed by the coating unit SC to the feed unit SN6 of the buffer unit BU3 of the ID block 2.

[Step S53] Substrate Transportation Between Two Buffers by ID Block 2

A step 53 is operated in the same manner as in the step S43. This step is briefly described. One of the substrate transport mechanisms MHU1, MHU2 of the ID block 2 transports the substrate W from the feed unit SN6 of the buffer unit BU3 to the feed unit SN1 of the buffer unit BU1.

[Step S54] Second Coating Treatment by Treatment Layer A1 (A2).

The treatment layer A1 receives the substrate W on which the lower layer is formed from the ID block 2. That is, the substrate transport mechanism MHU3 of the treatment layer A1 receives the substrate W from the feed unit SN1 in the buffer unit BU1. The substrate transport mechanism MHU3 transports the received substrate W to the coating unit SC and the predetermined heat-treatment unit 37 in this order. Thereafter, the substrate transport mechanism MHU3 transports the substrate W on which the middle film is formed by the coating unit SC to a predetermined position (e.g., substrate platform 31A) in the transfer unit PS1 of the buffer unit BU1 of the ID block 2.

[Step S55] Third Coating Treatment by Treatment Layer B1 (B2)

The treatment layer B1 receives the substrate W, transported to the ID block 2 by the treatment layer A1, from the ID block 2. That is, the substrate transport mechanism MHU4 of the treatment layer B1 receives the substrate W from a predetermined position (e.g., substrate platform 31A) in the transfer unit PS1 of the buffer unit BU1. The substrate transportation from the treatment layer A1 to the treatment layer B1 is performed without using the two substrate transport mechanisms MHU1, MHU2 of the ID block 2. The substrate transport mechanism MHU4 transports the received substrate W to the coating unit SC and the predetermined heat-treatment unit 37 in this order. Thereafter, the substrate transport mechanism MHU4 transports the substrate W on which a photoresist film is formed by the coating unit SC to the return unit RT1 of the buffer portion BU1 in the ID block 2.

[Step S56] Accommodating of Substrate W by ID Block 2

A step S56 is operated in the same manner as in the step S48. This step is briefly described. The substrate transport mechanism MHU2 receives the substrate W from the return unit RT1 of the buffer unit BU1, and transports the received substrate W to the carrier C placed on the platform 16 of the opener 13, for example.

Also, in this operational explanation, when the substrate W is transported to the treatment layer C1, the treatments are performed in the treatment layer C1, the treatment layer A1, and the treatment layer B1 in this order. Moreover, when the substrate W is transported to the treatment layer C2, the treatments are performed in the treatment layer C2, the treatment layer A2, and the treatment layer B2 in this order. The treatments may be performed in the treatment layer C1, the treatment layer A2, and the treatment layer B2 in this order. Moreover, the treatments may be performed in the treatment layer C2, the treatment layer A1, and the treatment layer B1 in this order.

According to the present embodiment, since both the first treating block 3 (treatment layer A1 and treatment layer C1) and the second treating block 5 (treatment layer B1) are connected to the ID block 2, reduction in throughput is suppressible. The substrate buffer BF is disposed in the middle of the treatment layer A1 and the treatment layer B1, for example. Therefore, transportation of the substrate W is performable from the treatment layer A1 to the treatment layer B1 through the substrate buffer BF. Since such transportation is performed without using the substrate transportation by ID block 2, reduction in burden of the substrate transportation by the ID block 2 is obtainable. Therefore, enhanced throughput is obtainable.

SIXTH EMBODIMENT

A sixth embodiment of the present invention will now be described with reference to the drawings. Here, the description common to that of the first to fifth embodiments is to be omitted.

In the fourth embodiment, the three types of treatments (the first to third treatments) are performed by the two treating block 3, 5. At this time, the treatment layer C1 performs the treatment prior to the treatments by the treatment layers A1 and B1, for example. In this regard, in the sixth embodiment, the treatment layer C1 performs a treatment after the treatments by the treatment layers A1 and B1.

Figure 23:
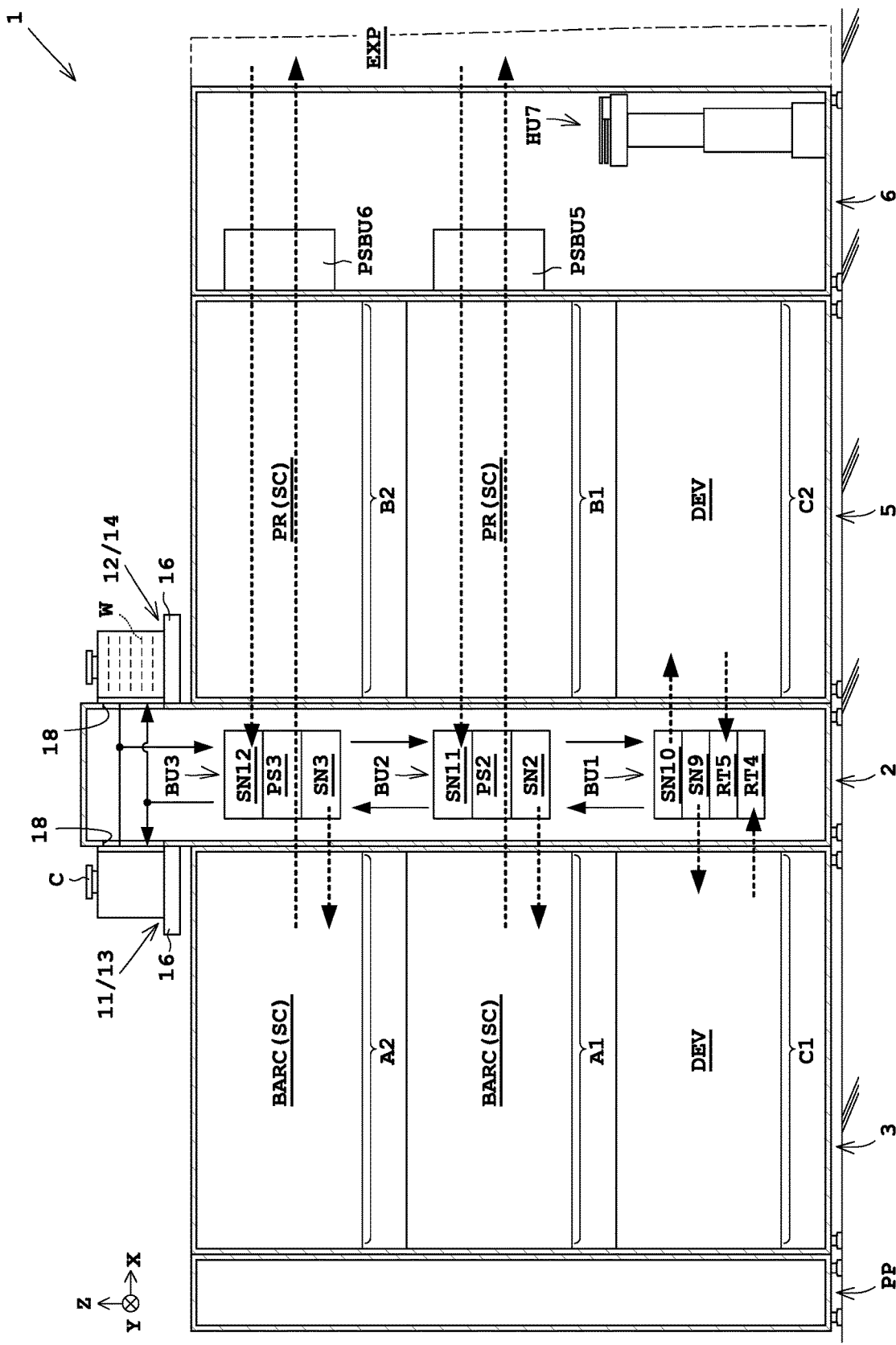
FIG. 23 is a right side view of a substrate treating apparatus according to a sixth embodiment.

Reference is made to FIG. 23. The first treating block 3 includes three treatment layers C1, A1, and A2 arranged to be stacked vertically. The second treating block 5 includes three treatment layers C2, B1, and B2 arranged to be stacked vertically. The treatment layer C1 is arranged in the same level as the treatment layer C2 and the buffer unit BU1. The treatment layer A1 is arranged in the same level as the treatment layer B1 and the buffer unit BU2. The treatment layer A2 is arranged in the same level as the treatment layer B2 and the buffer unit BU3. In the present embodiment, the buffer unit BU1 includes two feed units SN9, SN10, and two return units RT4, RT5. The buffer unit BU2 includes two feed units SN2, SN11 and a transfer unit PS2. The buffer unit BU3 includes two feed units SN3, SN12 and a transfer unit PS3. Each of the feed units SN9 to SN12 and the return units RT4, RT5, for example, is capable of placing a plurality of substrates W.

The two treatment layers A1, A2 each form an antireflection film on the substrate W, for example. The two treatment layers B1, B2 each form a photoresist film on the antireflection film of the substrate W, for example. Then, the two treatment layers C1, C2 each performs a developing treatment on the substrate W, for example. In FIG. 23, the second treating block 5 includes the treatment layer B2 and the treatment layer C2. The treatment layer B2 forms the photoresist film on the substrate W. The treatment layer C2 performs the developing treatment on the substrate W in a level (first floor) different from the treatment layer B2 (third floor). The first treating block 3, the ID block 2, the second treating block 5, and the IF block 6 are linearly connected in the horizontal direction in this order. In this embodiment, the first treating block 3 corresponds to the first treating device. The second treating block 5 and the IF block 6 correspond to the second treating device.

<Operation of Substrate Treating Apparatus 1>

Figure 24:
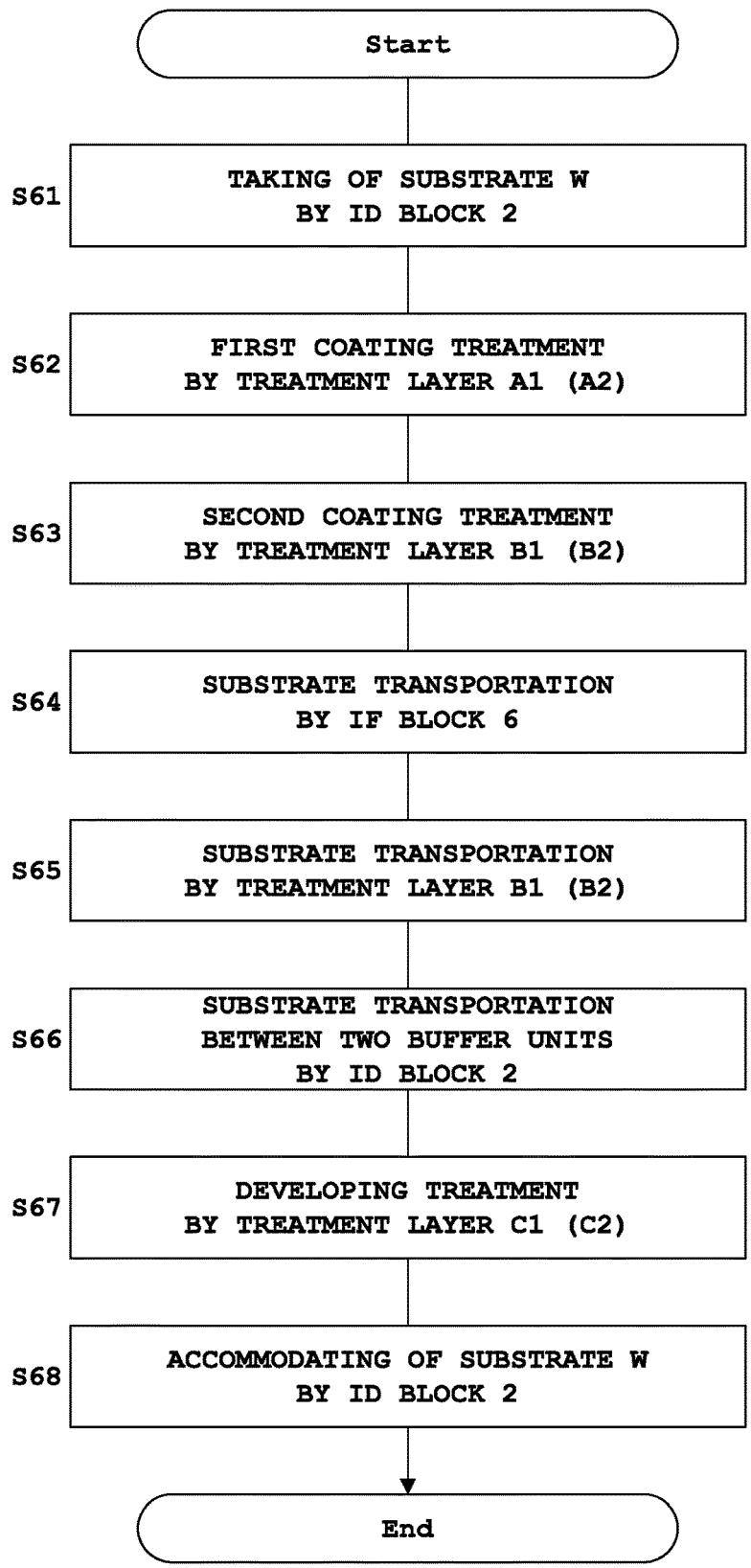
FIG. 24 is a flowchart illustrating operation of the substrate treating apparatus according to the sixth embodiment.

The following describes operation of the substrate treating apparatus 1 of this embodiment with reference to FIG. 23. FIG. 24 is a flowchart illustrating the operation of the substrate treating apparatus 1 according to the sixth embodiment.

[Step S61] Taking of Substrate W by ID Block 2

The substrate transport mechanism MHU1 of the ID block 2 takes a substrate W from the carrier C placed on the platform 16 of the opener 11, for example. The taken substrate W is transported by the substrate transport mechanism MHU1, for example, to the feed unit SN2 of the buffer unit BU2. This enables the treatment layer A1 to receive the substrate W. The substrate transport mechanism MHU1 transports the substrate W to the feed unit SN3 of the buffer unit BU3. This enables the treatment layer A2 to receive the substrate W.

[Step S62] First Coating Treatment by Treatment Layer A1 (A2)

The treatment layer A1 receives the substrate W from the ID block 2, and performs the treatment (the first treatment) of forming an anti-reflection film on the received substrate W. That is, the substrate transport mechanism MHU3 of the treatment layer A1 receives the substrate W from the feed unit SN2 in the buffer unit BU2. The substrate transport mechanism MHU3 transports the received substrate W to the coating unit BARC and the predetermined heat-treatment unit 37 in this order. Thereafter, the substrate transport mechanism MHU3 transports the substrate W on which an antireflective film is formed by the coating unit BARC to a predetermined position of the transfer unit PS2 of the buffer unit BU2 in the ID block 2. The treatment layer A2 receives the substrate W from the feed unit SN3 of the buffer unit BU3. The treatment layer A2 transports the received substrate W to the coating unit BARC and the predetermined heat-treatment unit 37 in this order. Thereafter, the treatment layer A2 transports the substrate W on which the antireflection film is formed to a predetermined position in the transfer unit PS3 of the buffer unit BU3 in the ID block 2.

[Step S63] Third Coating Treatment by Treatment Layer B1 (B2)

The treatment layer B1 receives the substrate W, transported to the ID block 2 by the treatment layer A1, from the ID block 2. That is, the substrate transport mechanism MHU4 of the treatment layer B1 receives the substrate W from the predetermined position in the transfer unit PS2 of the buffer unit BU2. The substrate transportation from the treatment layer A1 to the treatment layer B1 is performed without using the two substrate transport mechanisms MHU1, MHU2 of the ID block 2. The substrate transport mechanism MHU4 transports the received substrate W to the coating unit PR and the predetermined heat-treatment unit 37 in this order. Thereafter, the substrate transport mechanism MHU4 transports the substrate W on which the photoresist film is formed by the coating unit PR to the buffer unit PSBU5 of the IF block 6. The treatment layer B2 receives the substrate W from the predetermined position in the transfer unit PS3 of the buffer unit BU3. The treatment layer B2 transports the received substrate W to the coating unit PR and the predetermined heat-treatment unit 37 in this order. Thereafter, the treatment layer B2 transports the substrate W on which the photoresist film is formed to the buffer portion PSBU6 of the IF block 6.

[Step S64] Substrate Transportation by IF Block 6

The IF block 6 unloads the substrate W transported by the treatment layer B1 (B2) to the exposure device EXP. In addition, the IF block 6 loads the substrate W, subjected to the exposure treatment by the exposure device EXP, into the IF block 6. The substrate W subjected to the exposure treatment is transported to the buffer unit PSBU5 in order to be transported to the treatment layer B1. Moreover, the substrate W subjected to the exposure treatment is transported to the buffer unit PSBU6 in order to be transported to the treatment layer B2. The substrate W transported from the treatment layer B1 is returned to the treatment layer B1. The substrate W transported from the treatment layer B2 is returned to the treatment layer B2.

[Step S65] Substrate Transportation by Treatment Layer B1 (B2)

The treatment layer B1 receives the substrate W treated in the exposure device EXP from the IF block 6, and transports the received substrate W to the ID block 2. That is, the substrate transport mechanism MHU4 of the treatment layer B1 receives the substrate W, subjected to the exposure treatment, from the buffer unit PSBU5. Thereafter, the substrate transport mechanism MHU4 does not perform the coating treatment on the received substrate W, and the substrate transport mechanism MHU4 finally transports the received substrate W to the feed unit SN11 of the buffer unit BU2. The feed unit SN11 (SN12) is used for a substrate transportation between two levels. The treatment layer B2 receives the substrate W, subjected to the exposure treatment, from the buffer unit PSBU6, and finally transports the received substrate W to the feed unit SN12 of the buffer unit BU3.

[Step S66] Substrate Transportation Between Two Buffer Units by ID Block 2

The ID block 2 moves the exposed substrate W to a level of the treatment layer C1 (first floor). That is, one of the substrate transport mechanisms MHU1, MHU2 of the ID block 2 transports the substrate W from the feed unit SN11 of the buffer unit BU2 to the feed unit SN9 of the buffer unit BU1. This enables the treatment layer C1 to receive the substrates W. When the substrate W is treated in the treatment layers A2 and B2, the substrate W is transported from the feed unit SN12 of the buffer unit BU3 to the feed unit SN10 of the buffer unit BU1. This enables the treatment layer C2 to receive the substrate W.

[Step S67] Developing Treatment by the Treatment Layer C1 (C2)

The treatment layer C1 receives the exposed substrate W from the ID block 2. That is, the substrate transport mechanism MHU3 of the treatment layer C1 receives the substrate W from the feed unit SN9 of the buffer unit BU1. Thereafter, the substrate transport mechanism MHU3 transports the received substrate W to the developing unit DEV and the predetermined heat-treatment unit 37 in this order. Thereafter, the substrate transport mechanism MHU3 transports the substrate W, subjected to the developing treatment by the developing unit DEV, to the return unit RT4 of the buffer unit BU1 in the ID block 2. Here, the treatment layer C2 receives the substrate W from the feed unit SN10 of the buffer unit BU1. The treatment layer C2 transports the received substrate W to the developing unit DEV and the predetermined heat-treatment unit 37 in this order. Thereafter, the treatment layer C2 transports the substrate W, subjected to the developing treatment by the developing unit DEV, to the return unit RT5 of the buffer unit BU1 in the ID block 2.

[Step S68] Accommodating of Substrate W by ID Block 2

The ID block 2 returns the substrate W, subjected to the developing treatment, from the substrate buffer BF to the carrier C placed on the platform 16 of the opener 13, for example. That is, the substrate transport mechanism MHU2 receives the substrate W from the return unit RT4 (RT5) of the buffer unit BU1, and transports the received substrate W to the carrier C placed on the platform 16 of the opener 13.

In this operation explanation, the treatments are performed in the treatment layer A1, the treatment layer B1, and the treatment layer C1 in this order. Moreover, the treatments are performed in the treatment layer A2, the treatment layer B2, and the treatment layer C2 in this order. The treatments may be performed in the treatment layer A1, the treatment layer B1, and the treatment layer C2 in this order. The treatments may be performed in the treatment layer A2, the treatment layer B2, and the treatment layer C1 in this order.

According to the present embodiment, since both the first treating block 3 (treatment layer A2) and the second treating block 5 (treatment layer B2 and treatment layer C2) are connected to the ID block 2, reduction in throughput is suppressible. The substrate buffer BF is disposed in the middle of the treatment layer A2 and the treatment layer B2, for example. Therefore, transportation of the substrate W is performable from the treatment layer A2 to the treatment layer B2 through the substrate buffer BF. Since such transportation is performed without using the substrate transportation by ID block 2, reduction in burden of the substrate transportation by the ID block 2 is obtainable. Therefore, enhanced throughput is obtainable.

SEVENTH EMBODIMENT

A seventh embodiment of the present invention will now be described with reference to the drawings. Here, the description common to that of the first to sixth embodiments is to be omitted.

In the sixth embodiment, the substrate treating apparatus 1 includes the IF block 6. In this regard, in the seventh embodiment, the substrate treating apparatus 1 does not include the IF block 6 as shown in FIG. 25.

<Operation of Substrate Treating Apparatus 1>

Figure 25:
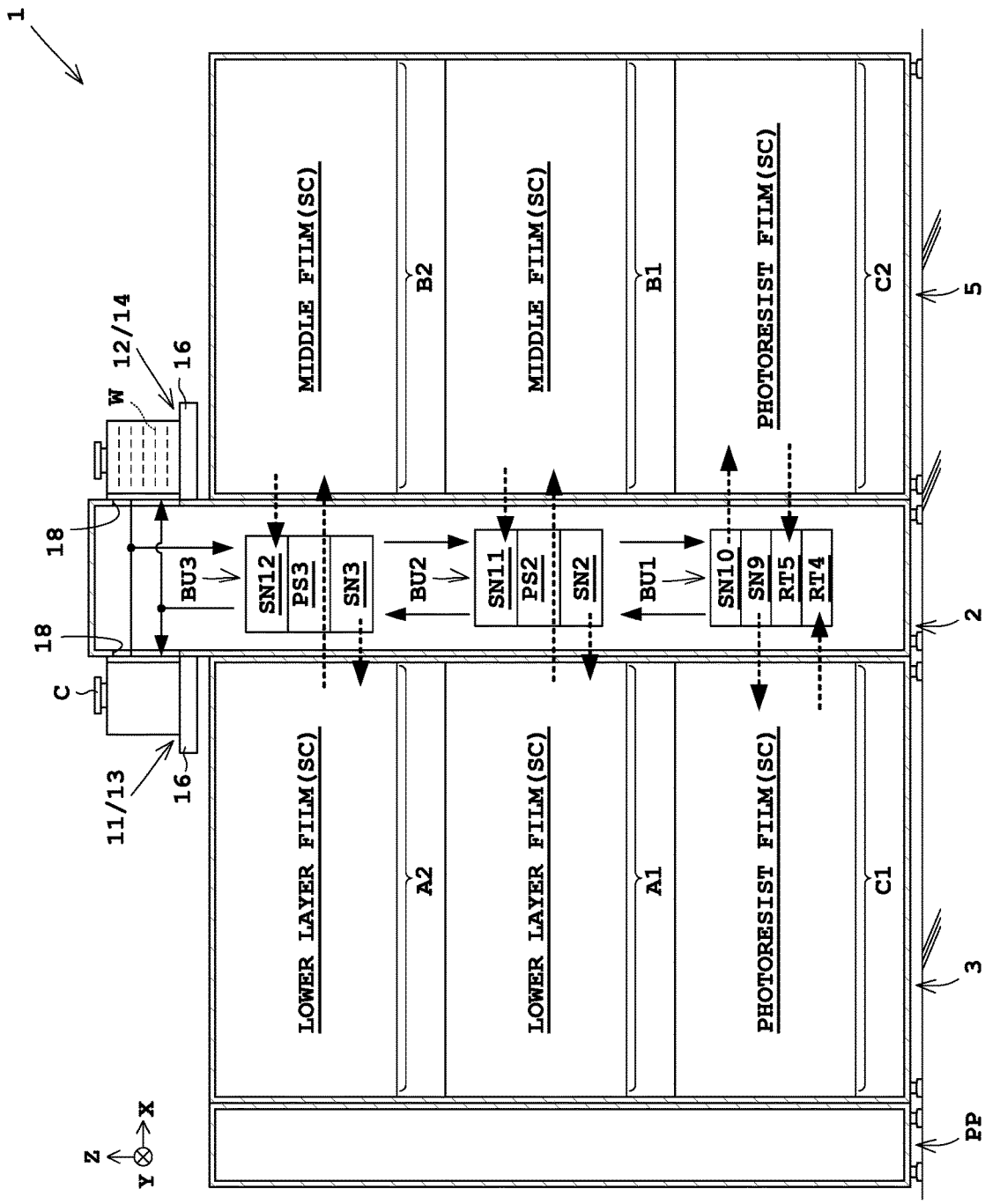
FIG. 25 is a right side view of a substrate treating apparatus according to a seventh embodiment.
Figure 26:
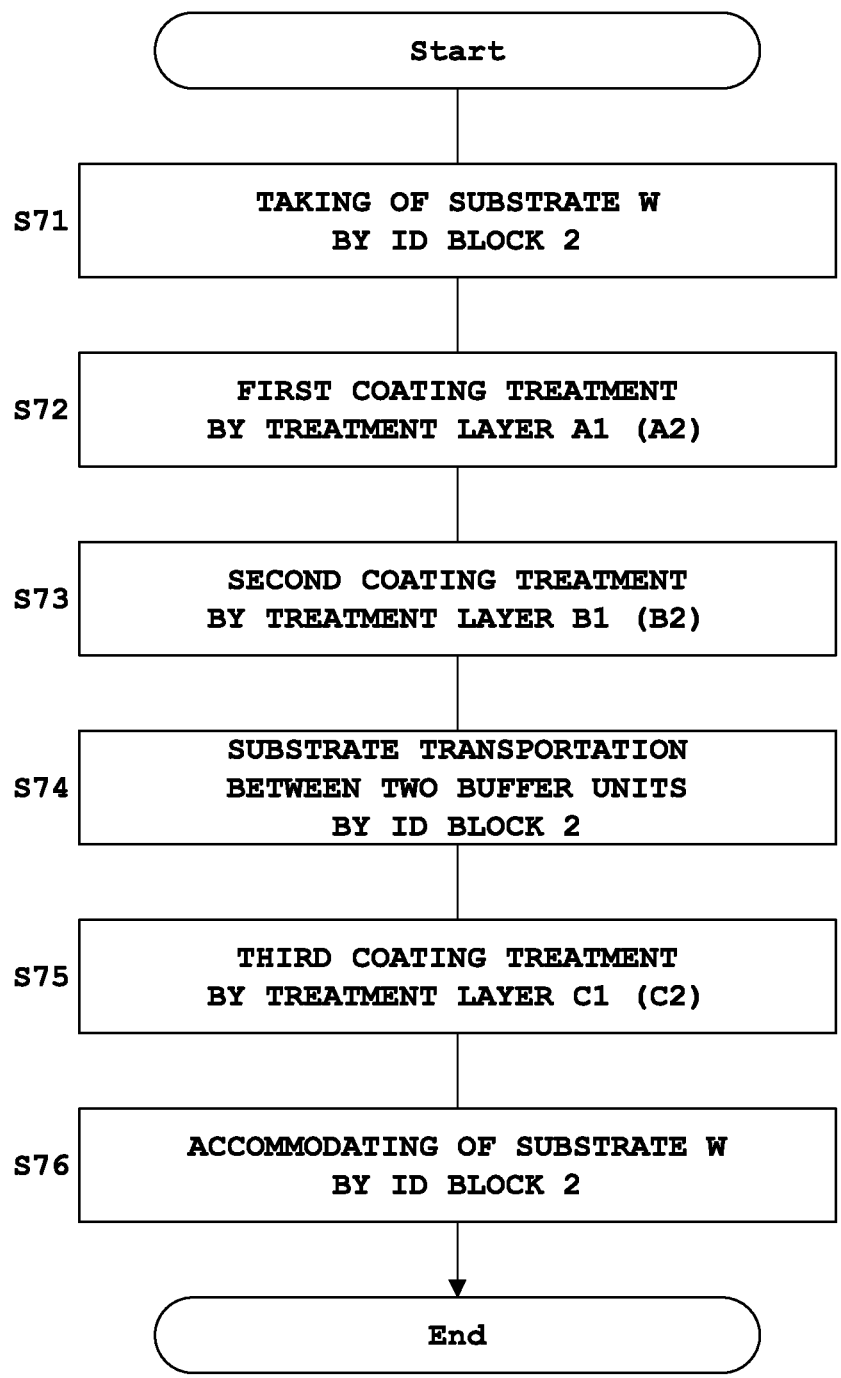
FIG. 26 is a flowchart illustrating operation of the substrate treating apparatus according to the seventh embodiment.

The following describes operation of the substrate treating apparatus 1 of this embodiment with reference to FIG. 25. The substrate treating apparatus 1 of this embodiment forms a three-layered film, for example. The two treatment layers A1, A2 each form a lower layer film. The two treatment layers B1, B2 each form a middle film. The two treatment layers C1, C2 each form a photoresist film FIG. 26 is a flow chart illustrating operation of the substrate treating apparatus 1 according to the seventh embodiment.

[Step S71] Taking of Substrate W by ID Block 2

The operations in the step S71 is the same as those in the step S61. This step is briefly described. The substrate transport mechanism MHU1 takes a substrate W from the carrier C placed on the platform 16 of the opener 11, for example. The taken substrate W is transported by the substrate transport mechanism MHU1, for example, to the feed unit SN2 (SN3) of the buffer unit BU2.

[Step S72] First Coating Treatment by Treatment Layer A1 (A2)

The treatment layer A1 receives the substrate W from the ID block 2, and performs the treatment (the first treatment) of forming the lower layer on the received substrate W. That is, the substrate transport mechanism MHU3 of the treatment layer A1 receives the substrate W from the feed unit SN2 in the buffer unit BU2. The substrate transport mechanism MHU3 transports the received substrate W to the coating unit SC and the predetermined heat-treatment unit 37 in this order. Thereafter, the substrate transport mechanism MHU3 transports the substrate W on which the lower layer film is formed by the coating unit SC to a predetermined position in the transfer unit PS2 of the buffer unit BU2 in the ID block 2. The treatment layer A2 receives the substrate W from the feed unit SN3 of the buffer unit BU2. Thereafter, the treatment layer A2 transports the substrate W on which the lower layer film is formed to a predetermined position in the transfer unit PS3 on the buffer unit BU3.

[Step S73] Second Coating Treatment by Treatment Layer B1 (B2)

The treating block B1 receives the substrate W, transported to the ID block 2 by the treatment layer A1, from the ID block 2. That is, the substrate transport mechanism MHU4 of the treatment layer B1 receives the substrate W from the predetermined position in the transfer unit PS2 of the buffer unit BU2. The substrate transportation from the treatment layer A1 to the treatment layer B1 is performed without using the two substrate transport mechanisms MHU1, MHU2 of the ID block 2. The substrate transport mechanism MHU4 transports the received substrate W to the coating unit SC and the predetermined heat-treatment unit 37 in this order. Thereafter, the substrate transport mechanism MHU4 transports the substrate W on which the middle film is formed by coating unit SC to the feed unit SN11 of the buffer unit BU2 in the ID block 2. The treatment layer B2 receives the substrate W from the predetermined position in the transfer unit PS3 of the buffer unit BU3. Thereafter, the treatment layer B2 transports the substrate W on which the middle film is formed to the feed unit SN12 in the buffer unit BU3.

[Step S74] Substrate Transportation Between Two Buffer Units by ID Block 2

The operations in the step S74 is the same as those in the step S66. This step is briefly described. One of the substrate transport mechanisms MHU1, MHU2 of the ID block 2 transports the substrate W from the feed unit SN11 of the buffer unit BU2 to the feed unit SN9 of the buffer unit BU1.

[Step S75] Third Coating Treatment by Treatment Layer C1 (C2)

The treatment layer C1 receives the substrate W on which the middle film is formed from the ID block 2. That is, the substrate transport mechanism MHU3 of the treatment layer C1 receives the substrate W from the feed unit SN9 of the buffer unit BU1. The substrate transport mechanism MHU3 transports the received substrate W to the coating unit PR and the predetermined heat-treatment unit 37 in this order. Thereafter, the substrate transport mechanism MHU3 transports the substrate W on which the photoresist film is formed to the return unit RT4 on the buffer portion BU1 of the ID block 2. Here, the treatment layer C2 receives the substrate W from the feed unit SN10. Thereafter, the treatment layer C2 transports the substrate W on which the photoresist film is formed to the return unit RT5 of the buffer unit BU1.

[Step S76] Accommodating of Substrate W by the ID Block 2

The ID block 2 returns the substrate W on which the photoresist film is formed from the substrate buffer BF to the carrier C placed on the platform 16 of the opener 13, for example. That is, the substrate transport mechanism MHU2 receives the substrate W from the return unit RT4 (RT5) of the buffer unit BU1, and transports the received substrate W to the carrier C placed on the platform 16 of the opener 13.

In this operation explanation, the treatments are performed in the treatment layer A1, the treatment layer B1, and the treatment layer C1 in this order. Moreover, the treatments are performed in the treatment layer A2, the treatment layer B2, and the treatment layer C2 in this order. The treatments may be performed in the treatment layer A1, the treatment layer B1, and the treatment layer C2 in this order. The treatments may be performed in the treatment layer A2, the treatment layer B2, and the treatment layer C1 in this order.

According to the present embodiment, since both the first treating block 3 (treatment layer A2) and the second treating block 5 (treatment layer B2 and treatment layer C2) are connected to the ID block 2, reduction in throughput is suppressible. The substrate buffer BF is disposed in the middle of the treatment layer A2 and the treatment layer B2, for example. Therefore, transportation of the substrate W is performable from the treatment layer A2 to the treatment layer B2 through the substrate buffer BF. Since such transportation is performed without using the substrate transportation by ID block 2, reduction in burden of the substrate transportation by the ID block 2 is obtainable. Therefore, enhanced throughput is obtainable.

The present invention is not limited to the foregoing examples, but may be modified as follows.

(1) In the embodiments described above, the treating blocks 3 and 5 each include three treatment layers (e.g., reference numerals A1 to A3) arranged vertically. In this regard, each of the treating blocks 3, 5 may include a single treatment layer. Alternatively, each of the treating blocks 3, 5 may include two treatment layers arranged vertically. Alternatively, each of the treating blocks 3, 5 may include four or more treatment layers arranged vertically.

(2) In the fourth and fifth embodiments described above, the two treatment layers C1, C2 shown in FIGS. 19 and 21 are arranged on the third floor. In this regard, the two treatment layers C1, C2 may be arranged on the first or second floor. Moreover, in the sixth and seventh embodiments described above, the two treatment layers C1, C2 shown in FIGS. 23 and 25 are arranged on the first floor. In this regard, the two treatment layers C1, C2 may be arranged on the second or third floor.

Figure 27:
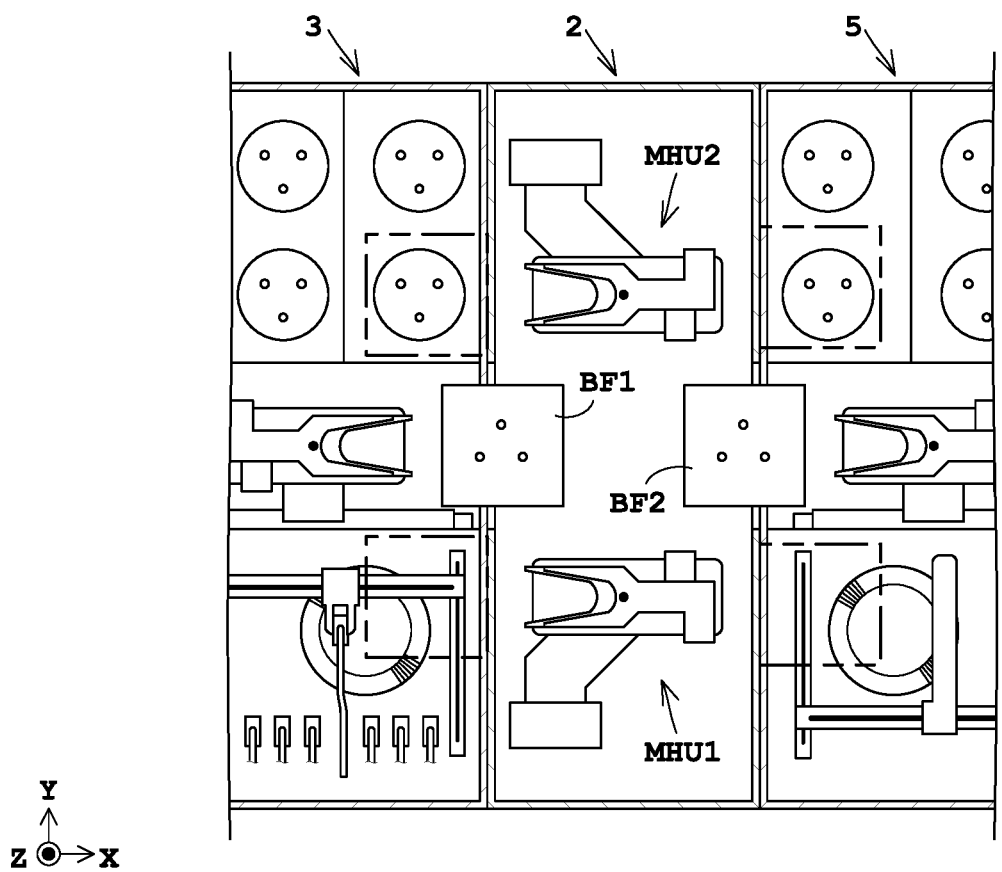
FIG. 27 illustrates a substrate buffer according to a modification.

(3) In the embodiments and modifications described above, one substrate buffer BF is disposed in the middle of the two treating blocks 3, 5, as in FIG. 3. That is, the substrate buffer BF is disposed at one position midway between the two treating blocks 3, 5. In this regard, the first substrate buffer BF1 may be provided between the first treating block and the ID block 2 as shown in FIG. 27. The second substrate buffer BF2 may be provided between the ID block 2 and the second treating block 5.

(4) In the embodiments and modifications described above, a cooling unit CP and an inspection unit LSCM2 (at least the inspection unit LSCM) may be provided in the ID block 2. The cooling unit CP and the inspection unit LSCM2 are disposed at least one of two positions indicated by the arrows ARR1, ARR2 in FIG. 4. In addition, the cooling unit CP and the inspection unit LSCM2 are provided for each level of the three treatment layers A1 to A3 in FIG. 2, for example. The inspection unit LSCM inspects the coating film (e.g., photoresist film) using a CCD camera or an image sensor. For example, the following may be performed. That is, the substrate W is subjected to the developing treatment, and the bake treatment after the developing treatment in the second treating block 5. Thereafter, the substrate W is transported to the cooling unit CP and the inspection unit LSCM2 in the ID block 2 in this order, and then is returned to the carrier C after inspection.

(5) In the embodiments and modifications described above, the ID block 2 includes four openers 11 to 14. The openers are not limited to four. For example, the ID block 2 may include only two openers 11, 13. In this instance, the opener 11 is used to take out the substrate W, whereas the opener 13 is used to accommodate the substrate W.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating system for treating substrates, comprising:
    an indexer block where a carrier platform for placing a carrier capable of accommodating the substrates is provided;
    a first treating device; and
    a second treating device, wherein
    the first treating device, the indexer block, and the second treating device are linearly connected in this order in a horizontal direction,
    the indexer block includes a substrate buffer for placing the substrates, the substrate buffer being disposed in the middle of the first treating device and the second treating device,
    the substrate buffer includes a plurality of substrate platforms arranged vertically so as to overlap one another in plan view,
    the plurality of substrate platforms are each configured to place one of the substrates thereon,
    the first treating device includes a first substrate transport mechanism having a first band for holding the one of the substrates and being movable for transporting the one of the substrates,
    the second treating device includes a second substrate transport mechanism having a second band for holding the one of the substrates and being movable for transporting the one of the substrates,
    the first substrate transport mechanism is configured such that the first hand can access the plurality of substrate platforms of the substrate buffer,
    the second substrate transport mechanism is also configured such that the second hand can access the plurality of substrate platforms of the substrate buffer,
    the indexer block takes one of the substrates from the carrier placed on the carrier platform, and transports the taken one of the substrates to the substrate buffer,
    the first treating device receives the one of the substrates from the substrate buffer, performs a predetermined treatment on the received one of the substrates, and transports the one of the substrates treated in the first treating device to the substrate buffer,
    the second treating device receives the one of the substrates, transported to the substrate buffer by the first treating device, from the substrate buffer, performs a predetermined treatment on the received one of the substrates, and transports the one of the substrates treated in the second treating device to the substrate buffer, and
    the indexer block returns the one of the substrates treated in the second treating device from the substrate buffer to the carrier placed on the carrier platform.

2. The substrate treating system according to claim 1, wherein
    the first treating device includes a first treating block for performing a first treatment on one of the substrates,
    the second treating device includes a second treating block for performing a second treatment on one of the substrates,
    the first treating block, the indexer block, and the second treating block are linearly connected in this order in the horizontal direction,
    the first treating block includes the first substrate transport mechanism,
    the second treating block includes the second substrate transport mechanism, the indexer block takes one of the substrates from the carrier placed on the carrier platform, and transports the taken one of the substrates to the substrate buffer, the first treating block receives the one of the substrates from the substrate buffer, performs the first treatment on the received one of the substrates, and transports the one of the substrates, subjected to the first treatment, to the substrate buffer, the second treating block receives the one of the substrates, transported to the substrate buffer by the first treating block, from the substrate buffer, performs the second treatment on the received one of the substrates, and transports the one of the substrates, subjected to the second treatment, to the substrate buffer, and the indexer block returns the one of the substrates, subjected to the second treatment, from the substrate buffer to the carrier placed on the carrier platform.

3. The substrate treating system according to claim 2, wherein the indexer block further includes an indexer substrate transport mechanism provided therein, the indexer substrate transport mechanism takes one of the substrates from the carrier placed on the carrier platform, and transports the taken one of the substrates to the substrate buffer, and the indexer substrate transport mechanism receives the one of the substrates, subjected to the second treatment, from the substrate buffer, and returns the received one of the substrates to the carrier placed on the carrier platform.

4. The substrate treating system according to claim 1, wherein the second treating device includes a second treating block and an interface block, the second treating block being connected to the indexer block and performing a second treatment on the one of the substrates, the interface block being connected to the second treating block and being configured to load and unload one of the substrates into and from an external device, the second treating block includes the second substrate transport mechanism, the second treating block receives the one of the substrates, transported to the substrate buffer by the first treating device, from the substrate buffer, and transports the received one of the substrates to the interface block, the interface block unloads the one of the substrates transported by the second treating block to the external device, and loads the one of the substrates treated into the external device, and the second treating block receives the one of the substrates treated in the external device from the interface block, performs the second treatment on the received one of the substrates, and transports the one of the substrates subjected to the second treatment, to the substrate buffer.

5. The substrate treating system according to claim 1, wherein the first treating device includes a first treating block and an interface block, the first treating block being connected to the indexer block and performing a first treatment on the one of the substrates, the interface block being connected to the first treating block and being configured to load and unload one of the substrates into and from an external device, the first treating block includes the first substrate transport mechanism, the first treating block receives the one of the substrates from the substrate buffer, performs the first treatment on the received of one of the substrates, and transports the one of the substrates subjected to the first treatment to the interface block, the interface block unloads the one of the substrates transported by the first treating block to the external device, and loads the one of the substrates treated into the external device, and the first treating block receives the one of the substrates treated in the external device from the interface block, and transports the received one of the substrates to the substrate buffer.

6. The substrate treating system according to claim 1, wherein the first treating device includes a first treatment layer configured to perform a first treatment on the one of the substrates, and a third treatment layer configured to performing a third treatment in a level different from a level of the first treatment layer, the first treatment layer includes the first substrate transport mechanism, the third treatment layer includes a third substrate transport mechanism having a third band for holding the one of the substrates and being movable for transporting the one of the substrates, the third substrate transort mechanism is also configured such that the third hand can access the plurality of substrate platforms of the substrate buffer, the indexer block takes one of the substrates from the carrier placed on the carrier platform, and transports the taken one of the substrates to the substrate buffer such that the third treatment layer enables reception of the one of the substrates, the third treatment layer receives the one of the substrates from the substrate buffer, performs the third treatment on the received one of the substrates and transports the one of the substrates, subjected to the third treatment, to the substrate buffer, the indexer block moves the one of the substrates, subjected to the third treatment, from the level of the third treatment layer to the level of the first treatment layer in the substrate buffer such that the first treatment layer enables reception of the one of the substrates, the first treatment layer receives the one of the substrates, subjected to the third treatment, from the substrate buffer, performs the first treatment on the received one of the substrates, and transports the one of the substrates, subjected to the first treatment, to the substrate buffer, and the second treating device receives the one of the substrates, transported to the substrate buffer by the first treatment layer, from the substrate buffer, performs a predetermined treatment on the received one of the substrates, and transports the one of the substrates treated in the second treating device to the substrate buffer.

7. The substrate treating system according to claim 1, wherein the second treating device includes a second treatment layer configured to perform a second treatment on the one of the substrates, and a third treatment layer configured to perform a third treatment in a level different from a level of the second treatment layer, the second treatment layer includes the second substrate transport mechanism, the third treatment layer includes a third substrate transport mechanism having a third band for holding the one of the substrates and being movable for transporting the one of the substrates,
the third substrate transport mechanism is also configured such that the third band can access the plurality of substrate platforms of the substrate buffer,
the second treatment layer receives the one of the substrates, transported to the substrate buffer by the first treating device, from the substrate buffer, performs the second treatment on the received one of the substrates, and transports the one of the substrates, subjected to the second treatment, to the substrate buffer,
the indexer block moves the one of the substrates, subjected to the second treatment, from the level of the second treatment layer to the level of the third treatment layer in the substrate buffer such that the third treatment layer enables reception of the one of the substrates,
the third treatment layer receives the one of the substrates, subjected to the second treatment, from the substrate buffer, performs the third treatment on the received one of the substrates, and transports the one of the substrates, subjected to the third treatment, to the substrate buffer, and
the indexer block returns the one of the substrates, treated in the third treatment layer from the substrate buffer to the carrier placed on the carrier platform.

8. The substrate treating system according to claim 1, wherein
the first treating device includes a first treating block connected to the indexer block, and an interface block connected to the first treating block, the interface block being configured to load and unload one of the substrates into and from an external device,
the first treating block includes a first treatment layer configured to perform a first treatment on the one of the substrates, and a third treatment layer configured to perform a third treatment in a level different from a level of the first treatment layer,
the first treatment layer includes the first substrate transport mechanism,
the third treatment layer includes a third substrate transport mechanism having a third band for holding the one of the substrates and being movable for transporting the one of the substrates,
the third substrate transport mechanism is also configured such that the third band can access the plurality of substrate platforms of the substrate buffer,
the indexer block takes one of the substrates from the carrier placed on the carrier platform, and transports the taken one of the substrates to the substrate buffer such that the third treatment layer enables reception of the one of the substrates,
the third treatment layer receives the one of the substrates from the substrate buffer, performs the third treatment on the received one of the substrates, and transports the one of the substrates, subjected to the third treatment, to the substrate buffer,
the indexer block moves the one of the substrates, subjected to the third treatment, from the level of the third treatment layer to the level of the first treatment layer in the substrate buffer such that the first treatment layer enables reception of the one of the substrates,
the first treatment layer receives the one of the substrates, subjected to the third treatment, from the substrate buffer, performs the first treatment on the received one of the substrates, and transports the one of the substrates subjected to the first treatment to the interface block,
the interface block unloads the one of the substrates transported by the first treatment layer to the external device, and loads the one of the substrates treated into the external device,
the first treatment layer receives the one of the substrates treated in the external device from the interface block, and transports the received one of the substrates to the substrate buffer, and
the second treating device receives the one of the substrates, transported to the substrate buffer by the first treatment layer, from the substrate buffer, performs a predetermined treatment on the received one of the substrates, and transports the one of the substrates treated in the second treating device to the substrate buffer.

9. The substrate treating system according to claim 1, wherein
the second treating device includes a second treating block connected to the indexer block, and an interface block connected to the second treating block, the interface block being configured to load and unload a one of the substrates into and from an external device,
the second treating block includes a second treatment layer configured to perform a second treatment on the substrate, and a third treatment layer configured to perform a third treatment in a level different from a level of the second treatment layer,
the second treatment layer includes the second substrate transport mechanism,
the third treatment layer includes a third substrate transport mechanism having a third band for holding the one of the substrates and being movable for transporting the one of the substrates,
the third substrate transport mechanism is also configured such that the third band can access the plurality of substrate platforms of the substrate buffer,
the second treatment layer receives the one of the substrates, transported to the substrate buffer by the first treating device, from the substrate buffer, performs the second treatment on the received one of the substrates, and transports the one of the substrates, subjected to the second treatment, to the interface block,
the interface block unloads the one of the substrates transported by the second treatment layer to the external device, and loads the one of the substrates treated into the external device,
the second treatment layer receives the one of the substrates treated in the external device from the interface block, and transports the received one of the substrates to the substrate buffer,
the indexer block moves the one of the substrates, subjected to the second treatment, from the level of the second treatment layer to the level of the third treatment layer in the substrate buffer such that the third treatment layer enables reception of the one of the substrates,
the third treatment layer receives the one of the substrates, subjected to the second treatment, from the substrate buffer, performs the third treatment on the received one of the substrates, and transports the one of the substrates, subjected to the third treatment, to the substrate buffer, and the indexer block returns the one of the substrates treated in the third treatment layer from the substrate buffer to the carrier placed on the carrier platform.

10. The substrate treating system according to claim 1, further comprising:
   a carrier storage shelf mounted on at least one of the indexer block, the first treating device, and the second treating device, and configured to store the carrier; and
   a carrier transport mechanism mounted on at least one of the indexer block, the first treating device, and the second treating device, and configured to transport the carrier between the carrier platform and the carrier storage shelf.

11. A substrate treating system for treating substrates, comprising:
   an indexer block where a carrier platform for placing a carrier capable of accommodating substrates is provided;
   a first treating device; and
   a second treating device, wherein
   the first treating device, the indexer block, and the second treating device are linearly connected in this order in a horizontal direction,
   the indexer block includes a substrate buffer for placing the substrates, the substrate buffer being disposed in the middle of the first treating device and the second treating device,
   the first treating device includes a first treating block and an interface block, the first treating block being connected to the indexer block and performing a first treatment on one of the substrates, the interface block being connected to the first treating block and being configured to load and unload the one of substrates into and from an external device,
   the indexer block takes the one of substrates from the carrier placed on the carrier platform, and transports the taken one of the substrates to the substrate buffer,
   the first treating block receives the one of the substrates from the substrate buffer, performs the first treatment on the received one of the substrates, and transports the one of the substrates subjected to the first treatment to the interface block,
   the interface block unloads the one of the substrates transported by the first treating block to the external device, and loads the one of the substrates treated into the external device, and
   the first treating block receives the one of the substrates treated in the external device from the interface block, and transports the received one of the substrates to the substrate buffer,
   the second treating device receives the one of the substrates, transported to the substrate buffer by the first treating device, from the substrate buffer, performs a predetermined treatment on the received one of the substrates, and transports the one of the substrates treated in the second treating device to the substrate buffer, and
   the indexer block returns the one of the substrates treated in the second treating device from the substrate buffer to the carrier placed on the carrier platform.

12. A substrate treating system for treating substrates, comprising:
   an indexer block where a carrier platform for placing a carrier capable of accommodating substrates is provided;
   a first treating device; and
   a second treating device, wherein
   the first treating device, the indexer block, and the second treating device are linearly connected in this order in a horizontal direction,
   the indexer block includes a substrate buffer for placing the substrates, the substrate buffer being disposed in the middle of the first treating device and the second treating device,
   the first treating device includes a first treating block connected to the indexer block, and an interface block connected to the first treating block, the interface block being configured to load and unload one of the substrates into and from an external device,
   the first treating block includes a first treatment layer configured to perform a first treatment on the one of the substrates, and a third treatment layer configured to perform a third treatment in a level different from a level of the first treatment layer,
   the indexer block takes one of the substrates from the carrier placed on the carrier platform, and transports the taken one of the substrates to the substrate buffer such that the third treatment layer enables reception of the one of the substrates,
   the third treatment layer receives the one of the substrates from the substrate buffer, performs the third treatment on the received one of the substrates, and transports the one of the substrates, subjected to the third treatment, to the substrate buffer,
   the indexer block moves the one of the substrates, subjected to the third treatment, from the level of the third treatment layer to the level of the first treatment layer in the substrate buffer such that the first treatment layer enables reception of the one of the substrates,
   the first treatment layer receives the one of the substrates, subjected to the third treatment, from the substrate buffer, performs the first treatment on the received one of the substrates, and transports the one of the substrates subjected to the first treatment to the interface block,
   the interface block unloads the one of the substrates transported by the first treatment layer to the external device, and loads the one of the substrates treated into the external device,
   the first treatment layer receives the one of the substrates treated in the external device from the interface block, and transports the received one of the substrates to the substrate buffer, and
   the second treating device receives the one of the substrates, transported to the substrate buffer by the first treatment layer, from the substrate buffer, performs a predetermined treatment on the received one of the substrates, and transports the one of the substrates treated in the second treating device to the substrate buffer, and
   the indexer block returns the one of the substrates treated in the second treating device from the substrate buffer to the carrier placed on the carrier platform.

* * * * *